United States Patent [19]
McCallister et al.

[11] Patent Number: 6,005,897
[45] Date of Patent: Dec. 21, 1999

[54] DATA COMMUNICATION SYSTEM AND METHOD THEREFOR

[76] Inventors: Ronald D. McCallister, 7701 E. Onyx Ct., Scottsdale, Ariz. 85258; Bruce A. Cochran, 1454 N. Parsell Cir., Mesa, Ariz. 85203; John M. Liebetreu, 9089 E. Davenport Dr., Scottsdale, Ariz. 85250

[21] Appl. No.: 08/991,385

[22] Filed: Dec. 16, 1997

[51] Int. Cl.$^6$ .................................................. H04L 27/38
[52] U.S. Cl. ........................ 375/340; 375/265; 714/790; 714/796
[58] Field of Search ..................... 375/261, 262, 375/265, 340, 341; 714/786, 790, 792, 794, 795, 796

[56] References Cited

U.S. PATENT DOCUMENTS

| | | | |
|---|---|---|---|
| 4,500,994 | 2/1985 | McCallister et al. | |
| 4,601,044 | 7/1986 | Kromer, III et al. | |
| 4,993,046 | 2/1991 | Saito et al. | |
| 5,111,484 | 5/1992 | Karabinis | 375/340 |
| 5,233,629 | 8/1993 | Paik et al. | |
| 5,233,630 | 8/1993 | Wolf | |
| 5,363,408 | 11/1994 | Paik et al. | 375/261 |
| 5,396,518 | 3/1995 | How | 375/265 |
| 5,408,502 | 4/1995 | How | 375/340 |
| 5,428,631 | 6/1995 | Zehavi | |
| 5,438,590 | 8/1995 | Tzukerman et al. | 375/259 |
| 5,469,452 | 11/1995 | Zehavi | |
| 5,511,096 | 4/1996 | Huang et al. | 375/265 |
| 5,621,762 | 4/1997 | Miller et al. | 375/298 |
| 5,633,881 | 5/1997 | Zehavi et al. | 371/37.5 |
| 5,666,170 | 9/1997 | Stewart | 348/726 |
| 5,668,820 | 9/1997 | Ramesh et al. | 371/43.1 |
| 5,790,596 | 8/1998 | Sexton | 375/228 |
| 5,832,001 | 11/1998 | Choi | 371/43.2 |
| 5,878,085 | 3/1999 | McCallister et al. | 375/280 |
| 5,910,967 | 6/1999 | Vanderaar | 375/265 |

OTHER PUBLICATIONS

C.Melvil Thomas, Michael Y Weidner and S.H. Durrani, "Digital Amplitude–Phase Keying with M–ary Alphabets", IEEE Transactions on Communications Feb. 1974, vol. Com–22, No. 2 pp. 168–179.

Viterbi, et al. A Pragmatic Approach to Trellis—Coded Modulation, IEEE Communications Magazine, Jul. 1989 pp. 11–19.

Wolf and Zehavi, "P$^2$Codes: Pragmatic Trellis Codes Utilizing Punctured Convolutional Codes", IEEE Communications Magazine, Feb. 1995 pp. 94–99.

Washio, et al. "Experimental Study on a New 1.6GBPS 16–Level APSK Modem", NTC '77 Conference Record vol. 1.

Primary Examiner—Young T. Tse
Attorney, Agent, or Firm—Lowell W. Gresham; Jordan M. Meschkow; Meschkow & Gresham, P.L.C.

[57] ABSTRACT

A digital communication system (20) communicates using a polar amplitude phase shift keyed (P-APSK) phase point constellation (70, 70'). Pragmatic encoding and puncturing is accommodated. The pragmatic encoding uses the P-APSK constellation (70, 70') to simultaneously communicate both encoded and uncoded information bits. The P-APSK constellation (70, 70') has an even number of phase point rings (74, 76) and equal numbers of phase points (72) in pairs of the rings (74, 76). Encoded bits specify secondary modulation and uncoded bits specify primary modulation. The constellation (70, 70') is configured so that secondary modulation sub-constellations (78) include four phase points (72) arranged so that two of the four phase points (72) exhibit two phase angles at one magnitude and the other two of the four phase points exhibit phase angles that are at another magnitude. The difference between the phase angles at different magnitudes within a secondary sub-constellation (78) is constant.

40 Claims, 9 Drawing Sheets

70    FIG. 4

DATA COMMUNICATION SYSTEM AND METHOD THEREFOR

TECHNICAL FIELD OF THE INVENTION

The present invention relates generally to the field of digital communications. More specifically, the present invention relates to encoders and decoders used in connection with pragmatic trellis coded modulation.

BACKGROUND OF THE INVENTION

Data communications systems face a wide range of performance demands. These demands include bandwidth efficiency, power efficiency, signal-to-noise (SNR) efficiency, and robustness. Bandwidth efficiency refers to successfully communicating data using as little bandwidth as possible. Power efficiency refers to transmitting as much energy per bit as possible for a given amount of consumed power. SNR efficiency refers to successfully communicating data using as little energy per bit as possible. Robustness refers to tolerating a variety of transmission channels characteristics. While conventional system designs often attempt to meet these demands independently of one another, they are interrelated.

Phase shift keying (PSK) represents a class of modulations that do a good job of meeting power efficiency, SNR efficiency, and some robustness demands. Power efficiency is achieved because PSK modulations convey data using phase, but not amplitude, relationships between quadrature components of a digital communication transmission signal. Since amplitude is not modulated, highly efficient class-C amplifiers may be employed in transmitters. SNR efficiency is achieved by using any of a wide variety of conventional coding schemes. One popular coding scheme is concatenated coding. Typically, a block code, such as a Reed-Solomon code, is applied as an outer code, and a convolutional code, such as the well known K=7, rate ½ "Viterbi" convolutional code, is applied as an inner code.

Another popular coding scheme is pragmatic trellis coded modulation (PTCM). PTCM has become popular because it allows a single convolutional encoder and decoder to achieve respectable coding gains for a wide range of bandwidth efficiencies (e.g. 1–6 b/s/Hz) and a wide range of higher order coding applications, such as 8-PSK, 16-PSK, 16-QAM, 32-QAM, etc. Accordingly, PTCM addresses both SNR efficiency and robustness. PTCM may be used within a concatenated coding scheme. For lower order coding applications, such as QPSK or BPSK, PTCM offers no advantage because quadrature, complex communication signals provide two independent dimensions (i.e. I and Q) per unit baud interval with which to convey two or fewer symbols per unit interval. PTCM solves some of the robustness demands because a wide range of coding applications can be accommodated with a single set of hardware.

Generally, PTCM conveys "coded" bits with "uncoded" bits during each unit interval. In other words, each phase point of a phase constellation is defined by both coded and uncoded bits. The coded bits receive convolutional encoding and the uncoded bits do not. Regardless of modulation order or type, the convolutional coding parameters are the same for any of a wide range of coding applications.

Unfortunately, the PSK class of modulations exhibit relatively poor bandwidth efficiency and are conventionally unable to resolve some robustness demands, such as rotational invariance. Accordingly, digital communication systems occasionally look to amplitude phase shift keying (APSK) modulation to achieve bandwidth efficiency over PSK modulation.

APSK modulation achieves performance improvements over an otherwise equivalently ordered PSK modulation. APSK modulations convey data using both amplitude and phase relationships between quadrature components of a digital communication transmission signal. A prior art rectilinear APSK (R-APSK) phase constellation 10 is shown in FIG. 1. Constellation 10 and other R-APSK modulations are conventionally referred to as quadrature amplitude modulation (QAM), but will be referred to herein using the generic term "R-APSK" to distinguish them from polar APSK (P-APSK) modulations, discussed below.

R-APSK constellations represent a special class of constellations where one set of symbols is conveyed independently of another set of symbols. In 16 R-APSK (i.e. 16-QAM), two symbols are communicated using I phase constellation axis perturbations and two symbols are communicated using Q phase constellation axis perturbations. Since the I and Q axes are orthogonal, the two sets of symbols have no influence over one another.

PTCM has been adapted to R-APSK constellations with moderate success. Typically, one coded bit and one uncoded bit are conveyed by perturbations about each of the I and Q axes. Unfortunately, conventional R-APSK constellations do not achieve rotationally invariant communication systems without accepting a tremendous degradation in performance (e.g. 4 dB). Without rotational invariance, the duration required for a decoder to achieve synchronization is much longer than with rotational invariance. When rotational invariance is sacrificed, conventional R-APSK constellations achieve acceptable performance, but performance is still not optimized.

FIG. 1 denotes a sub-constellation 12 included in the exemplary 16 R-APSK constellation 10. Sub-constellation 12 shares a common data value for the two coded information bits communicated during any single unit interval. Those skilled in the art will appreciate that constellation 10 actually includes four similar sub-constellations 12, but only one is shown for clarity. FIG. 1 further denotes a single minimum sub-constellation Euclidean distance 14 and a single minimum sub-constellation Euclidean distance 16 for the 16 R-APSK example. Minimum secondary distance 14 is the smallest distance between phase points in constellation 10. Minimum distance 16 is the smallest distance between phase points in any given sub-constellation 12.

The value of these minimum distances has a large influence on bandwidth and SNR efficiencies. One reason R-APSK communication systems do not demonstrate better performance is believed to be that these distances result from discrete, independent I, Q values which dictate the positions of the phase points in constellation 10. For example, constellation 10 is achieved when phase points have I and Q coordinates consisting of all sixteen combinations of ±1 and ±3, scaled by a factor of $2/(3\sqrt{2})$. Minimum distance 14 is $2/(3\sqrt{2})$, and minimum distance 16 is $4/(3\sqrt{2})$. As a result, the performance of the coded bits are not balanced with the performance of the uncoded bits unless signal-to-noise ratio is held at a single specific value.

Furthermore, conventional applications of PTCM to R-APSK constellations provide an excessive number of phase points at the respective minimum distances from other phase points. For the 16 R-APSK example depicted in FIG. 1, four minimum Euclidean distances 16 exist for each of the four sub-constellations 12, resulting in a total of 16 Euclidean distances 16 in constellation 10. This large number of minimum Euclidean distances 16 causes performance to suffer.

While R-APSK constellations achieve bandwidth efficiency over PSK modulation, they do so at a severe cost in power efficiency. Consequently, R-APSK constellations are particularly undesirably when used on peak power limited channels, such as characterize satellite communications. As illustrated by FIG. 1 for a specific 16 R-APSK constellation, phase points reside in three concentric rings. Peak transmitter power is required to transmit phase points on the outer ring. In random data, only ¼ of the data are transmitted at this peak power. Accordingly, this transmitter peak power capability is used to transmit only ¼ of the data, resulting in an inefficient use of the peak power capability. In general, R-APSK constellations require an excessive number of phase point rings for a given number of phase points in the constellation, and this excessive number of rings causes an inefficient use of transmitter power so that an undesirably low amount of power is transmitted per bit on average.

Moreover, transmitter amplifiers introduce AM-AM and AM-PM distortions in the signals they amplify. AM-AM distortions characterize non-linear amplitude variations in an amplifier output signal which occur as a function of input amplitude but are not explained by amplifier gain. AM-PM distortions characterize phase variations in an amplifier output signal which occur as a function of input amplitude. The use of an excessive number of rings in R-APSK for a given number of phase points requires transmitter amplifiers to operate at an excessive number of input amplitude states and causes an excessive amount of AM-AM and AM-PM distortions.

In theory, P-APSK constellations should have superior characteristics to R-APSK constellations, particularly in peak power limited channels. P-APSK constellations can be arranged so that a greater percentage of random data is transmitted using the peak power to achieve transmitter amplifier utilization efficiency. In addition, AM-AM and AM-PM distortions can theoretically be reduced if fewer rings are used to implement a phase constellation when compared to a R-APSK constellation having an equivalent number of phase points.

Unfortunately, conventional P-APSK constellations are not adapted to PTCM communication systems. Accordingly, such constellations have been proposed in either uncoded or in fully coded applications. Uncoded applications apply no convolutional coding to the communicated information bits, and fully coded applications apply convolutional coding to all communicated information bits. Uncoded applications are highly undesirable because they demonstrate significantly degraded performance when compared with equivalent pragmatic or fully coded applications. Fully coded applications are undesirable because they require the use of different convolutional encoders and decoders for different modulation orders.

Likewise, conventional receiver decoders have been unable to adequately adapt to a wide range of modulation types, orders and coding rates, particularly when configured to decode PTCM. For high speed digital communication applications, high data rates dictate that hardware rather than software, be primarily used to encode and decode data. Conventional practices require new hardware to accommodate new convolutional codes, coding rates and phase point constellations. This is an undesirably expensive and time consuming undertaking.

The puncturing of convolutional codes is a conventional technique for increasing a code rate at the expense of code strength. Prior art communication systems have applied puncturing to R-APSK and PSK, PTCM schemes. Punctured codes simply refrain from transmitting a portion of the convolutionally encoded bits between a transmitter and a receiver. Sufficient redundancy is built into the convolutional code that the original uncoded data stream may be reconstructed without communicating the omitted encoded bits. Even though certain encoded bits are not transmitted, they must be compensated for at the receiver. Accordingly erasures are inserted at the receiver for the omitted encoded bits prior to convolutional decoding.

The prior art systems which employ puncturing conventionally insert a constant erasure value that does not vary regardless of any particular received phase state. This technique works acceptably well when the conveyed encoded symbols are independent of one another. However, a cost of independently conveyed encoded symbols is the use inefficient phase constellation configurations for PTCM systems, such as R-APSK.

SUMMARY OF THE INVENTION

Accordingly, it is an advantage of the present invention that an improved data communication system and method are provided.

Another advantage of the present invention is that a phase point constellation is provided which is suitable for PTCM communication schemes.

Another advantage of the present invention is that a P-APSK constellation is provided which is suitable for use in peak power limited channels.

Another advantage of the present invention is that a P-APSK constellation is provided for use in PTCM applications in which secondary modulation performance can be substantially balanced with primary modulation performance over a range of signal-to-noise ratio.

Another advantage of the present invention is that a P-APSK constellation is provided for which minimum primary sub-constellation Euclidean distances are maximized while the quantity of such distances is minimized.

Another advantage is that a PTCM data communication system and method are provided which rely upon dependent encoded symbols.

Another advantage is that a PTCM data communication system is provided which permits puncturing even though encoded symbols are dependent upon one another.

Another advantage is that a PTCM data communication system is provided which is programmable to operate in connection with a variety of diverse modulation formats, orders and code rates.

The above and other advantages of the present invention are carried out in one form by an apparatus for pragmatically encoding information bits to be communicated at a rate of four or more symbols per unit interval. The apparatus includes a parsing circuit for distributing the information bits, a convolutional encoder, and a polar amplitude phase shift keyed (P-APSK) mapping circuit. The convolutional encoder couples to said parsing circuit and is configured to produce at least two convolutionally encoded bits for each information bit processed through it. The P-APSK mapping circuit is configured to receive at least two of the information bits from said parsing circuit per unit interval and two of the convolutionally encoded bits per unit interval. The mapping circuit is further configured to implement a phase point constellation having phase points arranged in concentric rings wherein, for each ring having a predetermined number of said phase points, there is provided another ring having said predetermined number of phase points.

The above and other advantages of the present invention are carried out in another form by an apparatus for decoding a punctured, convolutionally encoded data stream. This apparatus includes a phase estimator configured to generate phase estimate values. A depuncture circuit couples to the phase estimator. The depuncture circuit is configured to periodically generate erasure values so that the erasure values vary in response to the phase estimate values. A convolutional decoder couples to the depuncture circuit and is configured to be responsive to the erasure values.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 2:
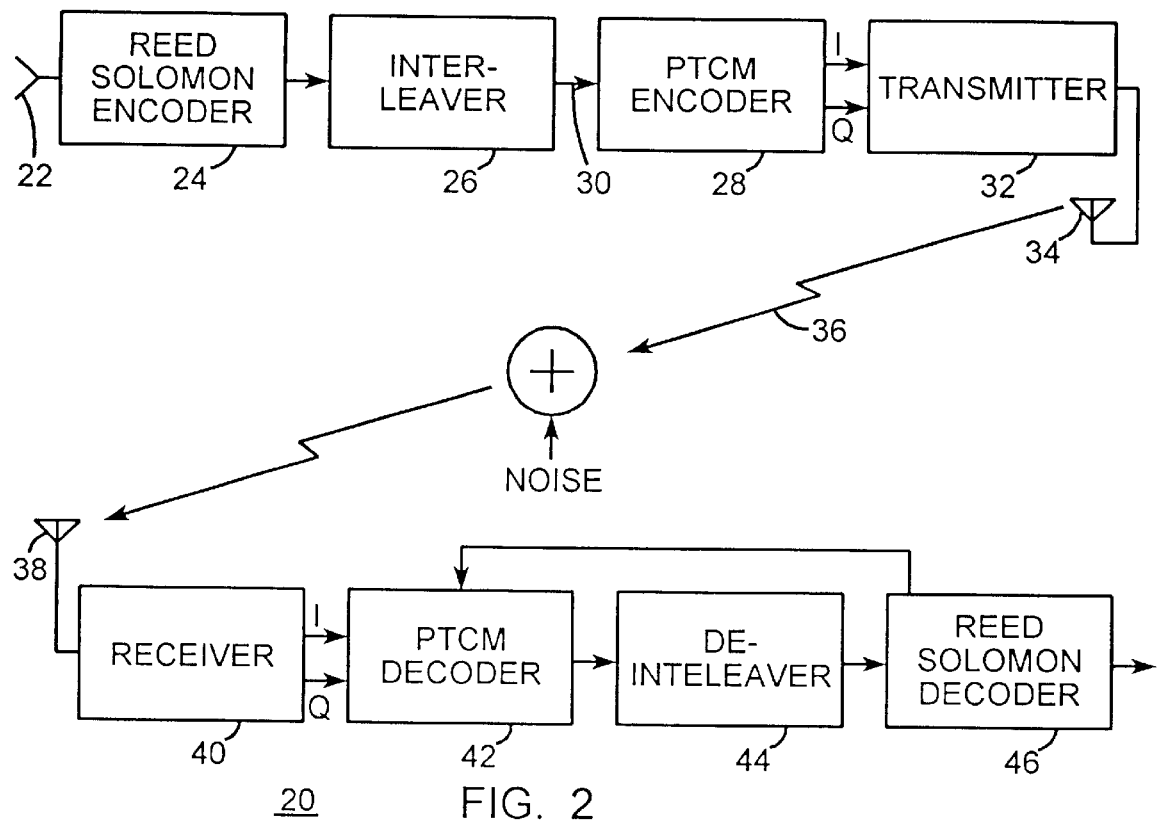
FIG. 2 shows a block diagram of a data communication system configured in accordance with the teaching of the present invention.

FIG. 2 shows a block diagram of a digital communication system 20 configured in accordance with the teaching of the present invention. At a supply point 22, system 20 receives information bits or user data to be transmitted. In one embodiment of the present invention, concatenated coding is implemented. Accordingly, in this embodiment supply point 22 couples to an input of a Reed-Solomon or other block encoder 24. An output of Reed-Solomon encoder 24 couples to an input of an interleaver 26, and an output of interleaver 26 couples to an input of a pragmatic trellis coded modulation (PTCM) encoder 28. In another embodiment of the present invention, concatenated coding is omitted, and information bits are applied directly to PTCM encoder 28. For convenience, the data supplied to PTCM encoder 28 are referred to herein as information bits 30 regardless of whether concatenated coding is implemented. PTCM encoder 28 is discussed in more detail below in connection with FIGS. 3–9.

Figure 1:
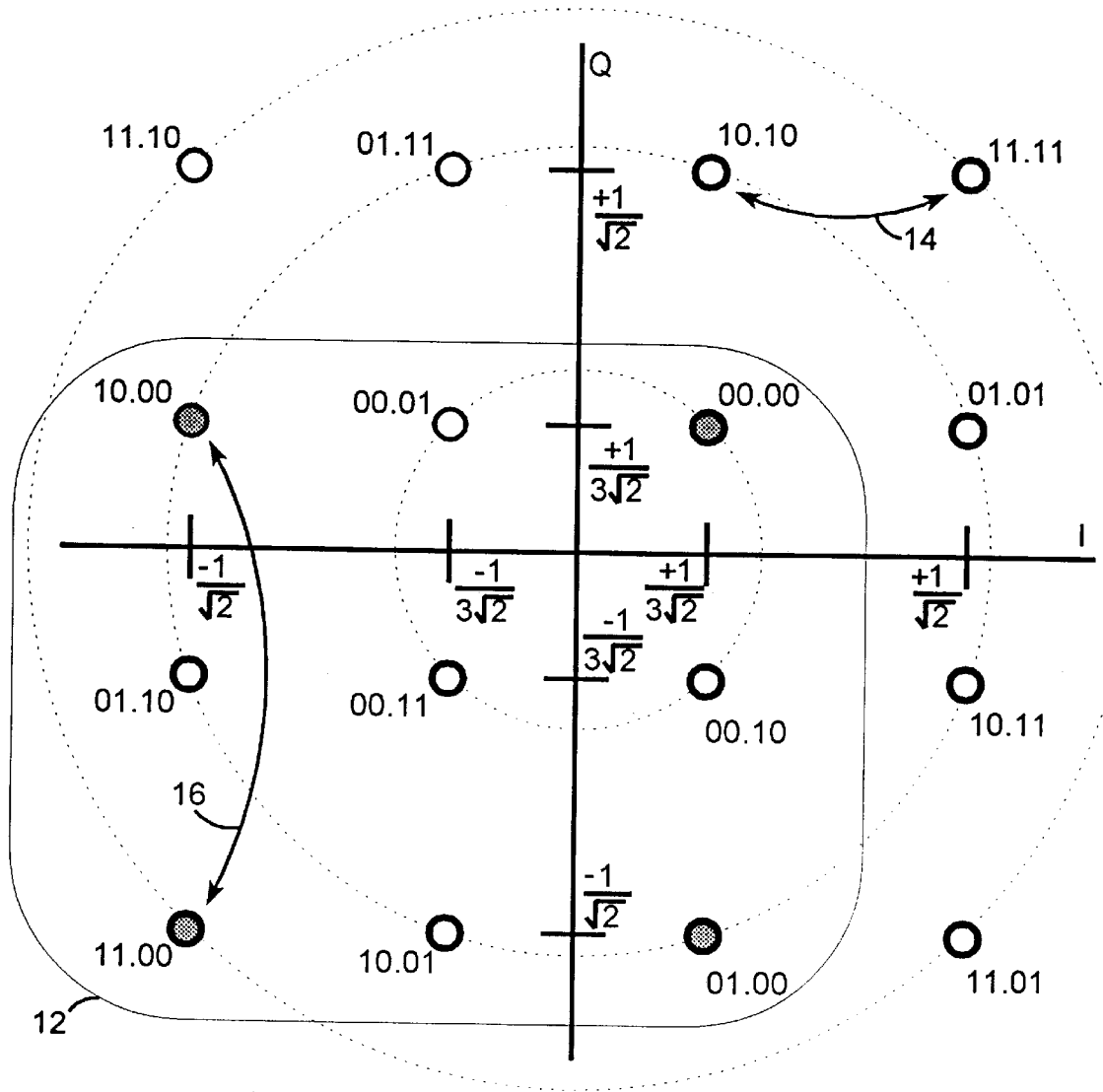
FIG. 1 shows a phase point constellation used in a prior art data communication system.

PTCM encoder 28 generates phase point data that may be in the form of I and Q quadrature signals which are supplied to a transmitter 32. Transmitter 32 couples to an antenna 34 from which a digital communication signal 36 is broadcast through a communication channel. As illustrated in FIG. 1, digital communication signal 36 is invariably corrupted to some degree by noise within the communication channel. This noise-corrupted digital communication signal 36 is received at an antenna 38 which couples to an input of a receiver 40. In the preferred embodiments, receiver 40 implements a carrier-coherent reception scheme. Receiver 40 produces rectilinear (i.e. I and Q) or polar (i.e. $\phi$ and M, not shown) quadrature components which are then supplied to a PTCM decoder 42. PTCM decoder 42 is discussed in more detail below in connection with FIGS. 10–11.

PTCM decoder 42 generates estimates of original information bits 30. In one embodiment of the present invention an output of PTCM decoder 42 couples to an input of a deinterleaver 44, an output of which couples to an input of a Reed-Solomon or other block decoder 46. In another embodiment, deinterleaver 44 and Reed-Solomon decoder 46 are omitted. When Reed-Solomon decoder 46 is included, an output which indicates when valid data are being received is fed back to PTCM decoder 42 to aid in achieving node synchronization (i.e. to determine frame timing). However, if Reed-Solomon decoder 42 is omitted, then other node synchronization techniques known to those skilled in the art may be used to identify frame timing.

Figure 3:
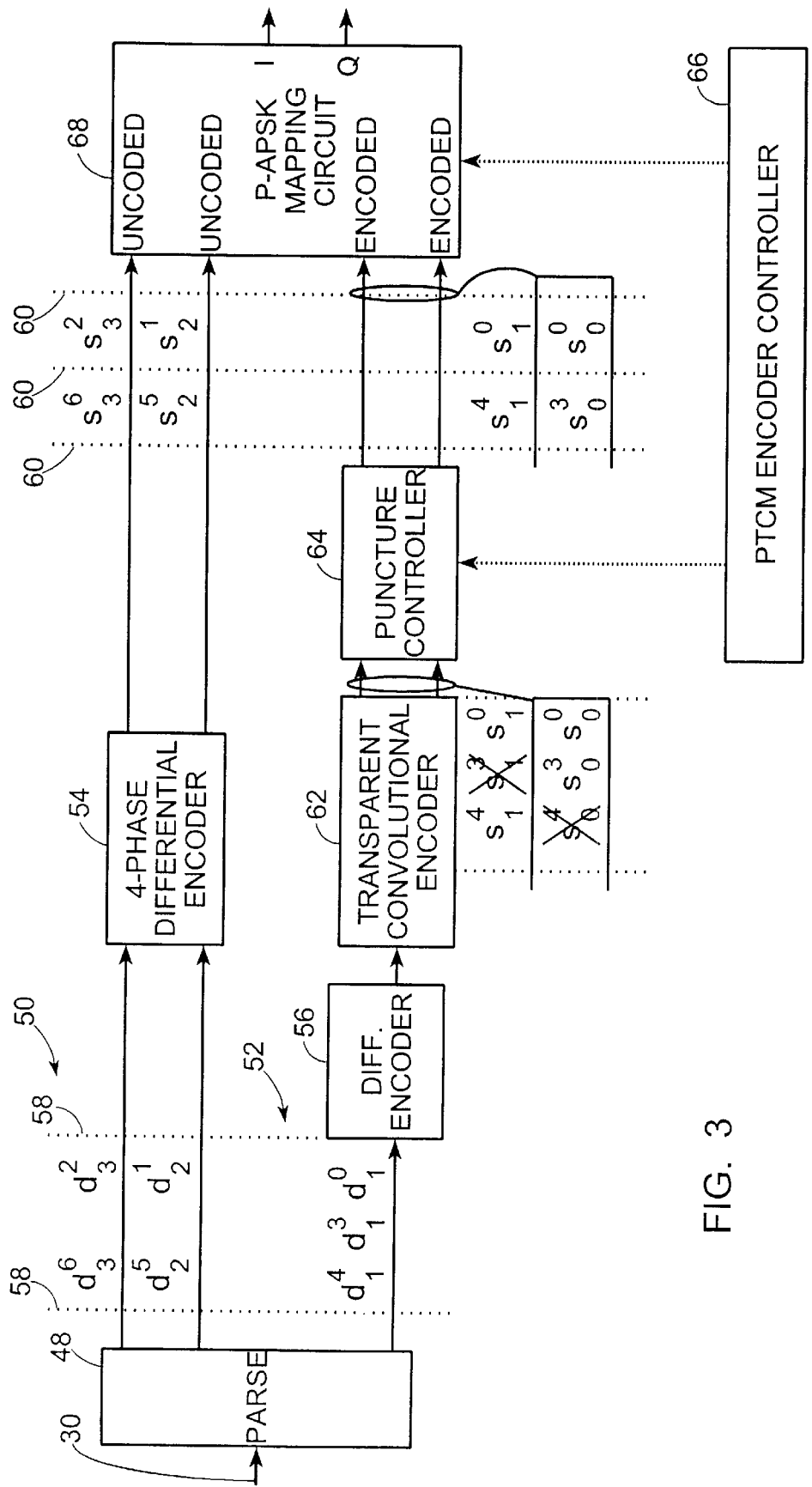
FIG. 3 shows a block diagram of a pragmatic trellis coded modulation (PTCM) encoder portion of the communication system shown in FIG. 2.

FIG. 3 shows a block diagram of PTCM encoder 28. A stream of information bits 30 is applied to an input of a parsing circuit 48. Parsing circuit 48 partitions the information bits 30 into a primary stream 50 and a secondary stream 52. Primary stream 50 is distributed to a 4-phase differential encoder 54 and secondary stream 52 is distributed to a differential encoder 56. FIG. 3 denotes primary stream 50 of information bits as data (d) with a subscript of "2" or "3". Secondary stream 52 is denoted as data (d) with a subscript of "1". As discussed in more detail below, PTCM encoder 28 applies secondary modulation to secondary stream 52 and primary modulation to primary stream 50.

The present invention may be adapted to operate over a wide variety of modulation formats and orders and to produce a wide variety of effective code rates. However, for the sake of clarity the below-presented discussion focuses on a preferred embodiment which adapts the present invention to a 16 P-APSK modulation format and order to achieve various effective code rates. This 16 P-APSK preferred embodiment is further discussed in connection with a puncturing scheme that yields a rate ⅞ effective code rate. In other words, for every 7 data bits processed, 8 symbols are transmitted. However, puncturing is not a requirement, and an effective code rate of ¾ is easily achieved without puncturing.

In the preferred 16 P-APSK, rate ⅞ embodiment, parsing block 48 routes four of every seven information bits 30 into primary stream 50 and three of every seven information bits 30 into secondary stream 52. In particular, every zero-th, third, and fourth bit is routed to secondary stream 52 while every first, second, fifth, and sixth bit is routed to primary stream 50, as indicated by data (d) superscripts in FIG. 3. These seven bits are distributed by parsing circuit 48 over a period equivalent to two unit intervals. A two unit interval period is indicated between vertical dotted lines 58 in FIG. 3.

A unit interval of time is required by system 20 (see FIG. 2) to communicate a single phase point. In this 16 P-APSK embodiment, four symbols are communicated by a single phase point per unit interval. In a 64 P-APSK embodiment which is discussed below, six symbols are communicated by a single phase point per unit interval. The unit interval represents the reciprocal of the baud rate. Over each unit interval, the relative phase of quadrature components of digital communication signal 36 (see FIG. 1) transitions from one set of phase data (i.e. one phase point) to another.

During every two unit intervals, differential encoder 54 processes four information bits and produces four information bits that remain uncoded except for the differential encoding applied through differential encoder 54. In other words, differential encoder 54 processes and produces two information bits per unit interval. A single unit interval is indicated between vertical dotted lines 60 in FIG. 3. Encoder 54 generates an output which represents the difference between the two information bits being processed by encoder 54 for a current unit interval and the two information bits processed by encoder 54 for a previous unit interval. These information bits produced by differential encoder 54 are referred to as symbols (s).

In the preferred embodiment, differential encoder 56 is a two-phase differential encoder. In other words, encoder 56 generates an output which remains uncoded except for the differential encoding and which represents the difference between the current information bit being processed by encoder 56 and the previous information bit processed by encoder 56.

An output of differential encoder 56 couples to an input of a convolutional encoder 62. In the preferred embodiment, encoder 62 implements a transparent, recursive, K=7, rate ½ convolutional ("Viterbi") encoder. Encoder 62 may implement either a systematic or non-systematic code. Since encoder 62 implements a rate ½ code, two symbols (s) are produced for each information bit received from differential encoder 56. Over the above-discussed two unit interval period, six encoded bits or symbols (s) are produced in response to the three information bits processed. FIG. 3 denotes the two symbols produced for each information bit processed by using the subscripts "0" and "1".

Since encoder 62 implements a transparent code, a linear relationship exists between the two outputs of encoder 62. In other words, if identical data streams except for one complemented bit are presented to encoder 62, then encoder 62 will produce corresponding symbol pairs for the data streams in which either both symbols are inverted or neither symbol is inverted.

The outputs of encoder 62 provide a secondary encoded bit stream to a puncture controller 64. Puncture controller 64 selectively removes predetermined bits from the secondary encoded bit stream and appropriately restructures the secondary encoded bit stream by delaying certain encoded bits as necessary.

For the rate ⅞ example, two encoded bits are punctured out of the secondary encoded bit stream during every two unit interval period. As illustrated in FIG. 3 between vertical lines 60, during a first unit interval, puncturing does not occur. The zero-th data bit $d_1^0$ is converted by convolutional encoder 62 into encoded bits or symbols $s_1^0$ and $s_0^0$. Encoded bits $s_1^0$ and $s_0^0$ are concurrently output from puncture controller 64 during the first unit interval of a two unit interval period.

Puncturing does occur during the second unit interval of the two unit interval period. The third data bit $d_1^3$ is converted by convolutional encoder 62 into encoded bits $s_1^3$ and $s_0^3$, but encoded bit $s_1^3$ is punctured out. The fourth data bit $d_1^4$ is converted by convolutional encoder 62 into encoded bits $s_1^4$ and $s_0^4$, but encoded bit $s_0^4$ is punctured out. Encoded bit $s_0^3$ is delayed so that it is output concurrently with encoded bit $s_1^4$ from puncture controller 64 during the second unit interval of the two unit interval period. Of course, a FIFO or other rate equalizing device (not shown) may be used by convolutional encoder 62 and/or puncture controller 64 to accommodate the diverse number of encoding operations which occur in different unit intervals.

Accordingly, for the rate ⅞ embodiment, three information bits 30 are processed through convolutional encoder 62 and puncture controller 64 over a two unit interval period to produce four encoded bits or symbols. In an alternate embodiment which has no puncturing, one information bit 30 is processed through convolutional encoder 62 and puncture controller 64 during each unit interval to produce two encoded bits or symbols. Of course, in this no-puncturing embodiment, puncture controller 64 may be omitted. In other embodiments, other code rates may be achieved by extending the puncturing frame over different numbers of unit intervals to puncture different fractions of the total number of encoded bits generated by convolutional encoder 62.

So that PTCM encoder 28 can operate over a range of diverse puncturing rates, a PTCM encoder controller 66 couples to puncture controller 64 to provide a data set which defines a particular puncturing scheme to implement. In one embodiment (not shown), puncture controller 64 includes two shift registers which are loaded in parallel with a data set pattern from controller 66 and which are clocked at twice the unit interval rate so that the data set patterns circulates therein. Puncture controller 64 also includes a multiplexer coupled to the output of convolutional encoder 62 and controlled by the two shift registers. The multiplexer drives a FIFO memory. The data set patterns indicate which encoded bits to puncture out. Non-punctured encoded bits are loaded into the FIFO memory in the sequence defined by the data set and pulled out synchronously with the occurrence of unit intervals. However, those skilled in the art can devise alternate implementation techniques for puncture controller 64.

Outputs from differential encoder 54 and from puncture controller 64 couple to inputs of a mapping circuit 68. In particular, outputs from differential encoder 54 drive uncoded inputs of mapping circuit 68 and outputs from puncture controller 64 drive encoded inputs of mapping circuit 68. Two encoded bits drive encoded inputs of mapping circuit 68 in parallel during each unit interval and $2^{N-2}$ uncoded bits drive uncoded inputs of mapping circuit 68 in parallel during each unit interval, where N is the modulation order. The modulation order N equals four for the 16 P-APSK preferred embodiment depicted in FIG. 3 and equals six for the 64 P-APSK preferred embodiment. Accordingly, mapping circuit 68 maps four or more symbols per unit interval.

Mapping circuit 68 implements a P-APSK phase point constellation arranged as discussed below. Mapping circuit 68 is desirably implemented as a random access memory (RAM) in which uncoded and encoded inputs represent memory address inputs. Thus, each mapping operation is performed by table look-up. In addition, data inputs of mapping circuit 68 couple to PTCM encoder controller 66 so that different phase point constellations can be loaded into mapping circuit 68 to efficiently implement different modulation orders and coding rates.

Mapping circuit 68 is configured to concurrently map uncoded information bits with encoded information bits. One mapping occurs for each unit interval. Each mapping causes a phase point to be produced. Each phase point is characterized by quadrature components which exhibit a predetermined relative magnitude and phase. During a unit interval, a phase point is processed through transmitter 32 (FIG. 2) and conveyed to receiver 40 (FIG. 2). However, the inevitable presence of noise, transmitter distortions, receiver distortions, and other factors invariably causes receiver 40 to receive a somewhat different phase point than was transmitted. Accordingly, the arrangement of phase points in a phase point constellation has a significant influence on the ability of receiver 40 to successfully recover communicated data.

Figure 4:
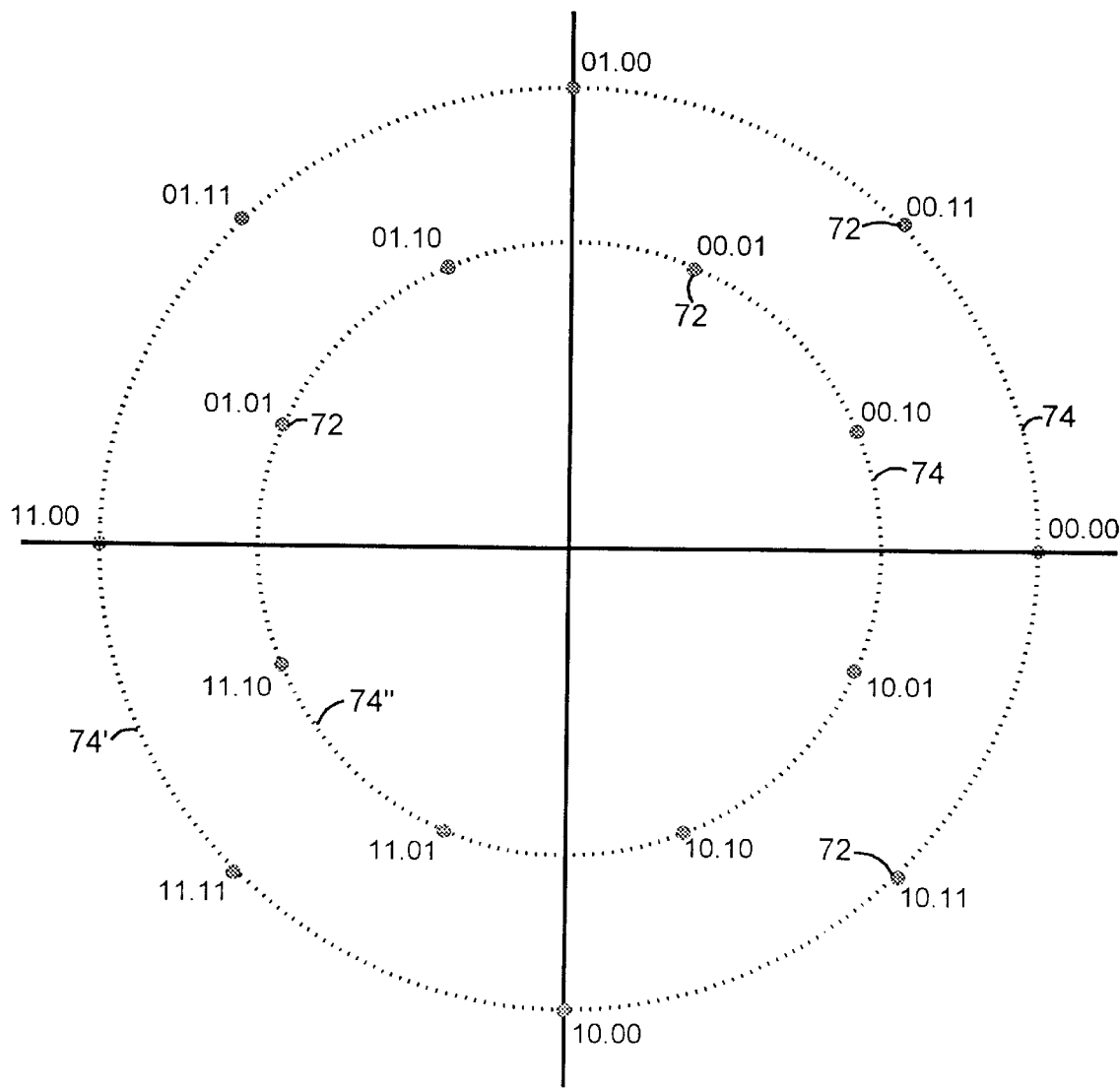
FIG. 4 shows a sixteen point, polar amplitude phase shift keyed (P-APSK) phase point constellation produced by a first embodiment of a mapping circuit portion of the encoder shown in FIG. 3.

FIGS. 4–9 graphically illustrate P-APSK phase point constellations implemented by preferred embodiments of the present innovation. FIG. 4 shows a sixteen point, P-APSK phase point constellation 70 produced by mapping circuit 68 (FIG. 3). Constellation 70 includes phase points 72 arranged in an even number of concentric rings 74 of phase points 72. A ring 74 represents those phase points 72 which have substantially equal magnitude.

Constellation 70 is derived from a QPSK constellation (not shown) for which pragmatic encoding has no benefit but which demonstrates desirable performance characteristics for uncoded or fully coded communications. A QPSK constellation (not shown) has a single ring of four phase points arranged 90° apart from adjacent phase points, implements a modulation order of two, and is used to communicate two symbols per unit interval.

Constellation 70 is derived from a QPSK constellation by providing four phase points 72 for each QPSK phase point. The four phase points 72 are provided by adding one phase point 72 to an outer "QPSK" ring 74' for each QPSK phase point to achieve a total of eight phase points 72 on outer ring 74'. Phase points 72 positioned in outer ring 74' are spaced 45° apart. An inner ring 74" is created in which two phase points 72 are provided for each QPSK phase point to achieve a total of eight phase points 72 on inner ring 74". Phase points 72 positioned in inner ring 74" are spaced 45° apart, but the phase points 72 of inner ring 74" are rotated 22.5° with respect to the phase points 72 of outer ring 74'.

Figure 5:
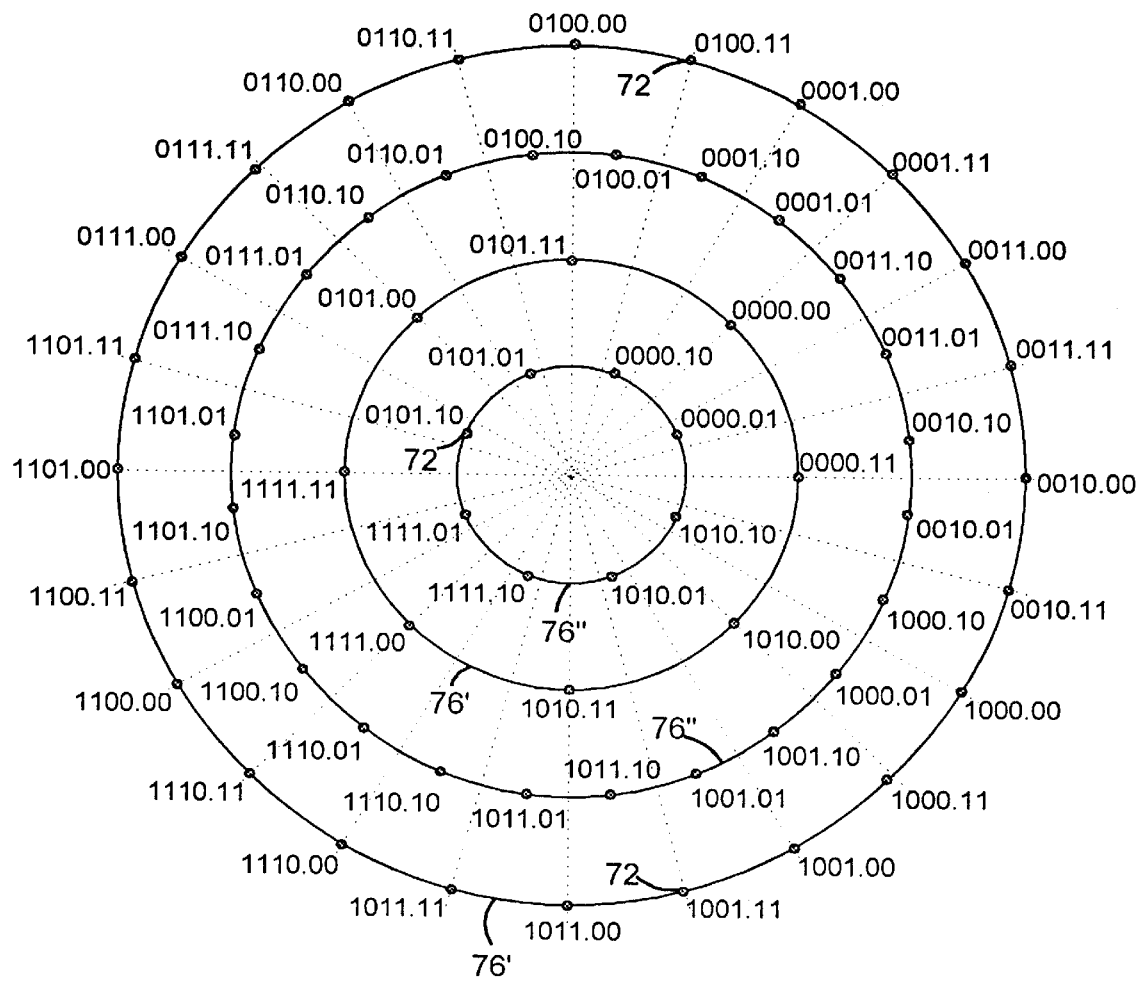
FIG. 5 shows a sixty-four point, P-APSK phase point constellation produced by a second embodiment of the mapping circuit portion of the encoder shown in FIG. 3.

FIG. 5 shows a sixty-four point, P-APSK phase point constellation 70' produced by mapping circuit 68 (FIG. 3) in accordance with the teaching of the present invention. Constellation 70' also includes phase points 72 arranged in an even number of concentric rings 76 of phase points 72.

Constellation 70' is derived from a 12/4, 16 P-APSK constellation (not shown) which is not well-suited to pragmatic encoding but which demonstrates desirable performance characteristics for uncoded or fully coded communications. A 12/4, 16 P-APSK constellation (not shown) has an inner ring of four phase points arranged 90° apart from adjacent phase points, an outer ring of twelve phase points arranged 30° apart, implements a modulation order of four, and is used to communicate four symbols per unit interval.

Constellation 70' is derived from a 12/4, 16 P-APSK constellation by providing four phase points 72 for each 12/4, 16 P-APSK phase point. The four phase points 72 are provided by adding one phase point 72 to outer "12/4, 16 P-APSK" rings 76' for each 12/4, 16 P-APSK phase point to achieve a total of twenty-four phase points 72 on an outer-outer ring 76' and eight phase points 72 on an outer-inner ring 76'. Phase points 72 positioned in outer-outer ring 76' are spaced 15° apart from adjacent phase points 72, and phase points 72 positioned on outer-inner ring 76' are spaced 45° apart from adjacent phase points 72. Inner rings 76" are created in which two phase points 72 are provided for each 12/4, 16 P-APSK phase point to achieve a total of twenty-four phase points 72 on an inner-outer ring 76" and eight phase points 72 on an inner-inner ring 76". Phase points 72 positioned in inner-outer ring 76" are spaced 15° apart, phase points 72 positioned on inner-inner ring 76" are spaced 45° apart, but the phase points 72 of inner rings 76" are rotated 7.5° and 22.5° relative to the phase points 72 of respective outer rings 76".

Referring to FIGS. 4 and 5, by deriving P-APSK constellations 70 and 70' from other constellations which provide desirable uncoded or fully coded performance, but possibly undesirable pragmatic encoded performance, an even number of rings 74 and 76 results. For each ring 74 or 76 having a given number of phase points 72, another ring 74 or 76 is provided having the same number of phase points 72. Inner-most rings 74 or 76 have eight phase points 72.

FIGS. 4 and 5 indicate preferred labeling schemes applied to phase points 72. The labeling schemes define primary and secondary sub-constellations. In addition, the labeling schemes cooperate in achieving rotational invariance, which is discussed below. FIGS. 4 and 5 show labeling schemes as a set of binary codes in which a unique binary code is associated with each phase point 72. By applying the indicated binary code to inputs of mapping circuit 68 (FIG. 3), the indicated phase point is produced. Likewise, when receiver 40 (FIG. 2) receives a phase point near those indicated in FIGS. 4 and 5, PTCM decoder 42 (FIG. 2) desirably generates data estimates corresponding to the indicated binary codes. FIGS. 4 and 5 denote two bits to the right of a radix point for each binary code and $2^{N-2}$ bits to the left of the radix point, where N equals the modulation order of four for constellation 70 and six for constellation 70'. The bits to the right of the radix point indicate encoded inputs to mapping circuit 68 and the bits to the left of the radix point indicate uncoded inputs to mapping circuit 68. However, the radix point has no significance other than distinguishing encoded bits from uncoded bits. Nothing requires encoded bits and uncoded bits to be in any particular order relative to each other. Rather, all encoded and uncoded bits are independent of each other.

While the encoded and uncoded driving bits for constellations 70 and 70' are independent of each other, the resulting phase point symbols into which the driving bits are mapped by mapping circuit 68 are not independent from one another in order to achieve desirable performance characteristics.

Figure 6:
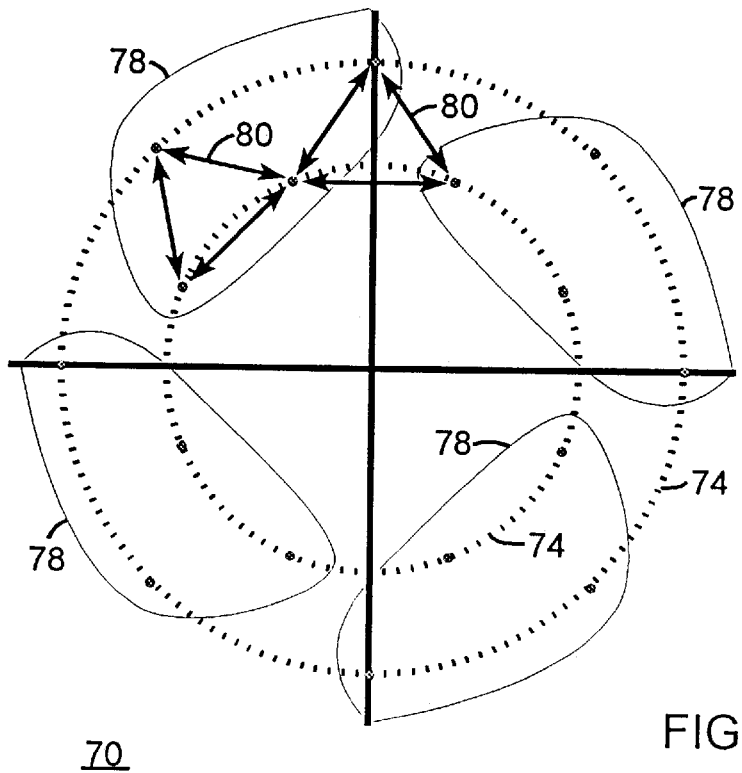
FIG. 6 shows the sixteen point, P-APSK phase point constellation of FIG. 4 with various secondary sub-constellation minimum Euclidean distances depicted thereon.
Figure 7:
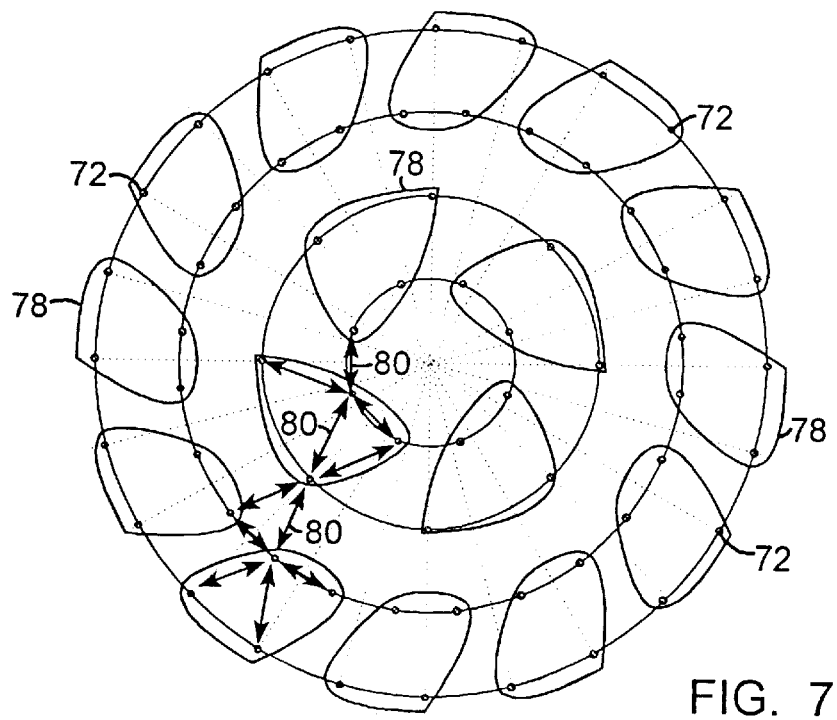
FIG. 7 shows the sixty-four point, P-APSK phase point constellation of FIG. 5 with secondary sub-constellations depicted.

FIGS. 6 and 7 show various secondary sub-constellations and secondary sub-constellation minimum Euclidean distances for constellations 70 and 70', respectively. FIGS. 6 and 7 omit the labeling denoted in FIGS. 4 and 5, respectively, for clarity, but this labeling defines the secondary sub-constellation groupings of phase points 72 and will be understood to apply to FIGS. 6 and 7. Each constellation 70 or 70' has $2^{N-2}$ secondary sub-constellations 78, where N equals the modulation order. Desirably, phase points 72 are clustered together in secondary sub-constellations 78 so that secondary sub-constellations 78 do not overlap and rotational invariance is achieved. As a consequence of this, the center of each sub-constellation 78 is not centered at the origin of constellation 70 or 70'.

Referring to FIGS. 4–7, secondary sub-constellations 78 are formed from those phase points 72 that have common data values for their uncoded inputs. Sub-constellations 70 and 70' have similar sub-constellation 78 features which lead to desirable performance characteristics. For example, the labeling applied to phase points 72 causes for each sub-constellation 78 to include two phase points 72 having a greater magnitude and two phase points 72 having a lesser magnitude. For a given magnitude within each sub-constellation 78, one phase point 72 exhibits a first phase angle and another phase point 72 exhibits a second phase angle. These first and second phase angles differ from one another by the same offset angle. For constellation 70 and the innermost two rings 76 of constellation 70', that offset angle is 45°. For the outermost two rings 76 of constellation 70', that offset angle is 15°.

However, the phase angles of phase points 72 in the outer ring 74 or 76 of each given secondary sub-constellation 78 do not equal the phase angles of phase points 72 in the inner ring 74 or 76. In other words, the inner ring phase angles are offset relative to the outer ring phase angles within each secondary sub-constellation 78. A benefit of this offset is improved performance achieved by spacing the inner ring phase points 72 farther away from the outer ring phase points 72.

However, the symbols or phase points produced by independent encoded input bits to mapping circuit 68 are dependent on one another. For example, the two encoded bits that drive mapping circuit 68 are responsible for identifying one of four possible phase points 72 within a sub-constellation 78 that has a given data value for uncoded bits. This one of four possible phase points 72 will have a specific phase angle and magnitude. Neither of the two driving encoded bits exclusively controls the phase angle or magnitude parameter, or an I and Q parameter if represented in accordance with a rectilinear coordinate system, and the absolute distances between adjacent phase points 72 within a given sub-constellation 78 will differ depending upon which two adjacent phase points 72 are being evaluated. For example, adjacent phase points 72 on the outer ring are farther apart than adjacent phase points 72 on the inner ring.

FIGS. 6 and 7 indicate a selection of candidates for secondary sub-constellation minimum Euclidean distances 80. Secondary sub-constellation minimum Euclidean distances 80 represent the distances between adjacent or otherwise nearby phase points 72 in constellations 70 and 70'. Of course, constellations 70 and 70' can be characterized as having numerous other Euclidean distances between phase points 72, but these minimum distances 80 are particularly influential in controlling performance. In this context, performance refers to the resulting error rate that results from operating at a given signal-to-noise ratio, modulation order, and effective coding rate. The smaller the minimum Euclidean distance 80, the worse the performance. However, this secondary modulation performance is compensated for by coding gain achieved through convolutional encoding. Accordingly, the code employed by convolutional encoder 62 (FIG. 3) along with the relative magnitude of rings 74 or 76 for constellation 70 or 70' define and establish the encoded bit performance of system 20.

Minimum distances 80 are candidate distances because not all such distances actually need to be absolute minimum distances. As the relative magnitude of rings 74 and 76 changes, these distances change. As inner rings get larger relative to outer rings, then the distances 80 between adjacent phase points 72 on the inner rings increase while the distances 80 between adjacent phase points 72 on different rings decrease. If, for 16 P-APSK example constellation 70, the inner ring 74 has a magnitude approximately 65% of the outer ring 74, then distances 80 between adjacent phase points on a common ring equal the distances 80 between adjacent phase points 72 on adjacent rings. Desirably, several minimum distances 80 in constellation 70 are nearly equal, and distances 80 are as large as possible. This is typically achieved when the magnitude of inner ring 74 is in the range of 60–72% of the magnitude of the outer ring 74.

Figure 8:
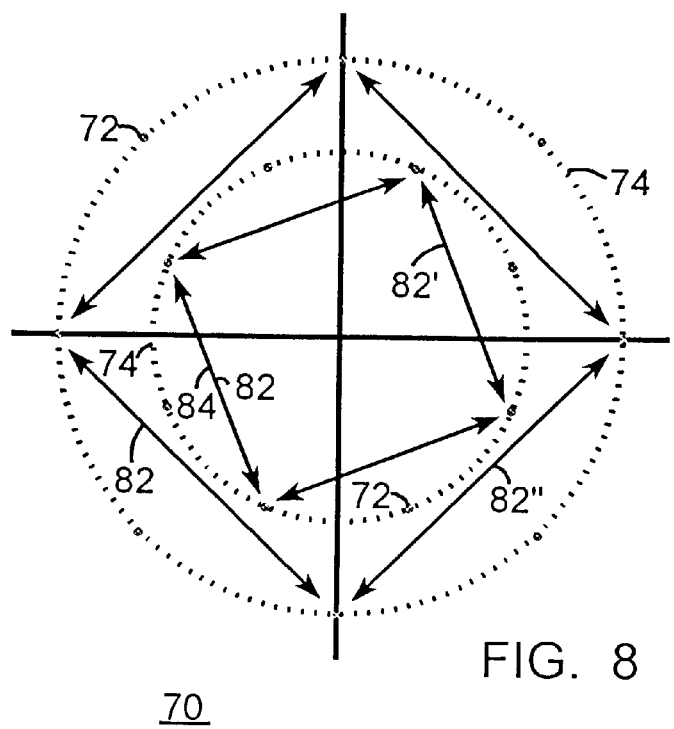
FIG. 8 shows the sixteen point, P-APSK phase point constellation of FIG. 4 with various primary sub-constellation minimum Euclidean distances for a first two primary sub-constellations depicted thereon.
Figure 9:
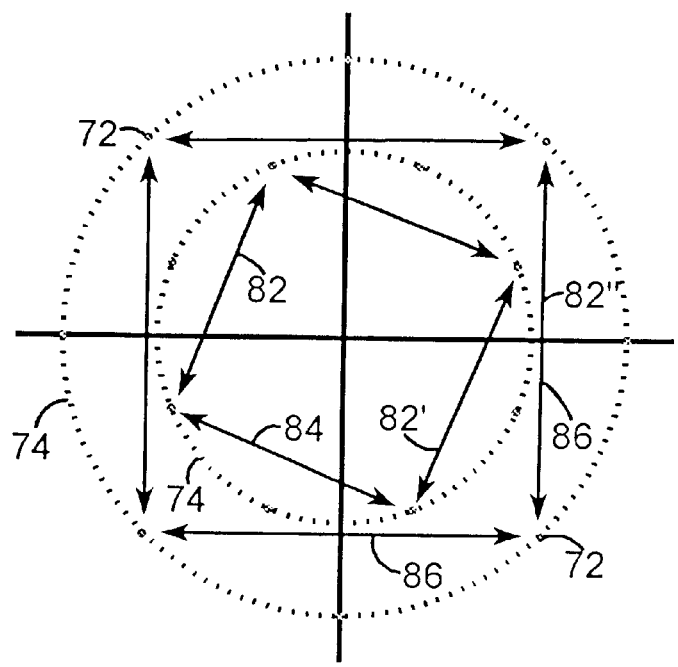
FIG. 9 shows the sixteen point, P-APSK phase point constellation of FIG. 4 with various primary sub-constellation minimum Euclidean distances for a second two primary sub-constellations depicted thereon.

FIGS. 8 and 9 also depict constellation 70. FIGS. 8 and 9 each depict two primary sub-constellations 82. Each of FIGS. 8 and 9 depict a single inner primary sub-constellation 82' and a single outer primary sub-constellation 82", but different primary sub-constellations 82 are depicted in FIGS. 8 and 9. Consequently, a total of four primary sub-constellations 82 are collectively depicted in FIGS. 8 and 9. Although not shown, constellation 70' (FIG. 5) also has four primary sub-constellations. Primary sub-constellations 82 coexist with secondary sub-constellations 78 (FIGS. 6–7). The different sub-constellations reflect different groupings applied to the same sets of phase points 72 by a preferred labeling scheme that causes a P-APSK constellation to accommodate pragmatic coding. For constellation 70', each of primary sub-constellations 82 resembles a square having corners at phase points 72 which are spaced 90° apart and reside at equal magnitudes away from the origin. The four primary sub-constellations 82 are rotated multiples of 22.5° from one another, with inner sub-constellations 82' being rotationally interspersed between outer sub-constellations 82".

Each primary sub-constellation 82 includes those phase points 72 that have common data values for their encoded inputs. From the perspective of PTCM decoder 42 (FIG. 2), when the data value of encoded bits has been resolved to a high degree of confidence, the primary sub-constellation 82 defined by this resolved data value for the encoded bits represents $2^{N-2}$ data values that are potentially expressed by the uncoded data bits conveyed by the same phase point.

FIGS. 8 and 9 also show minimum primary sub-constellation Euclidean distances 84 for inner primary sub-constellations 82' and minimum primary sub-constellation Euclidean distances 86 for outer primary sub-constellations 82". Distances 86 are significantly larger than distances 84. Accordingly, distances 84, rather than distances 86, exert a significant influence over the uncoded bit performance of constellation 70. As the magnitude of inner ring 74 increases, distances 84 increase, and the uncoded bit performance of constellation 70 improves. However, as discussed above, that improvement may come at the cost of a decrease in encoded bit performance. As the magnitude of inner ring 74 decreases, distances 84 decrease, and uncoded bit performance of constellation 70 deteriorates.

If the magnitude of the inner ring 74 is set at 67% of the magnitude of the outer ring 74, distances 84 become precisely equal to primary sub-constellation minimum Euclidean distances 16 for conventional 16 R-APSK modulation (FIG. 1). However, unlike R-APSK modulations, fewer than one minimum primary sub-constellation Euclidean distance 84 per phase point 72 results from P-APSK constellations 70 and 70' when the preferred constellation labeling scheme is used compared to one minimum primary sub-constellation Euclidean distance 16 (FIG. 1) per R-APSK phase point. In fact, only one-half of a minimum primary sub-constellation Euclidean distance 84 is provided per phase point 72 in preferred constellations 70 and 70'. For constellation 70 shown in FIGS. 8 and 9, a total of eight minimum primary sub-constellation Euclidean distances 84 exists. Consequently, other factors being equal, constellations 70 and 70' exhibit improved performance over their R-APSK counterparts.

Referring back to FIG. 6, constellation 70 includes twenty-four minimum secondary sub-constellation Euclidean distance candidates 80, which is the same number included in the corresponding prior art 16 R-APSK constellation 10 shown in FIG. 1. For comparison purposes, by operating the inner ring 74 at 67% of the magnitude of the outer ring 74, sixteen of these twenty-four distance candidates are only 2% less than the corresponding R-APSK minimum secondary sub-constellation Euclidean distances 14 (FIG. 1) while the remaining eight are 8% greater than the corresponding R-APSK minimum secondary sub-constellation Euclidean distances 14. As a result, when compared to a corresponding R-APSK constellation, operation of the inner ring 74 at 67% of the magnitude of the outer ring 74 yields improved performance.

However, those skilled in the art will appreciate that the present invention has no requirement that the inner ring 74 operate at precisely 67% of the magnitude of the outer ring 74. Rather, this 67% value is useful for comparison purposes with corresponding R-APSK constellations.

In one preferred embodiment, PTCM encoder controller 66 (FIG. 3) is configured to load a data set into mapping circuit 68 (FIG. 3) that establishes the magnitude of inner ring 74 relative to that of outer ring 74. This relative magnitude of rings 74 desirably causes uncoded bit performance to approximately equal coded bit performance at any given signal-to-noise ratio. Controller 66 may, for example, alter the magnitude of the inner ring 74 in response to a change in the amount of puncturing being performed on encoded bits, with all other factors remaining constant. If signal-to-noise ratio remains constant but the amount of puncturing increases to increase overall information data throughput, then the coding gain and overall performance applied to the secondary/encoded bit modulation is reduced. To compensate for a marginal decrease in coding gain, controller 66 may marginally decrease the magnitude of the inner ring 74 relative to that of the outer ring 74 so that the secondary/encoded bit performance remains approximately equal to the primary/uncoded bit performance.

Referring back to FIGS. 3 and 4, the preferred embodiment of PTCM encoder 28 is further configured to implement a rotationally invariant P-APSK constellation 70. Rotational invariance refers to an ability of receiver 40 (FIG. 2) to remain locked regardless of which of numerous potential phase points is currently being used by the receiver as a reference. This phenomenon is often referred to as a phase ambiguity. Differential encoders 54 and 56 of PTCM encoder 28 support rotational invariance. Those skilled in the art will appreciate that differentially encoded data may be correctly and easily decoded whether or not it has been inverted.

In addition, the binary labeling scheme applied to constellation 70 further supports rotational invariance. In the preferred labeling scheme of constellation 70, for each subject phase point 72, there exists two adjacent phase points 72 on the same ring 74 each of which is labeled to have a data value for its encoded inputs that is inverted from the data value for the encoded inputs for the subject phase point 72. As illustrated in FIGS. 4 and 6, a 45° offset, or any integer multiple thereof, in a phase reference for any secondary sub-constellation 78 causes the encoded bits to become inverted from their true values. This inversion is easily compensated through differential decoding. As will be understood from the below-presented discussion, if the encoded bits are detected in their inverted state, the resulting decisions regarding uncoded bits yield results that are likewise easily compensated through differential decoding. As further illustrated in FIGS. 4 and 6, a 90° offset, or any integer multiple thereof, in a phase reference for any secondary sub-constellation 78 results in a phase point 72 having the same encoded input data value. For this situation the correct, non-inverted, encoded bits are recovered in the receiver. Errors in uncoded bits due to the 90°, and integer multiples thereof, phase ambiguities are corrected through differential decoding in the receiver.

Figure 10:
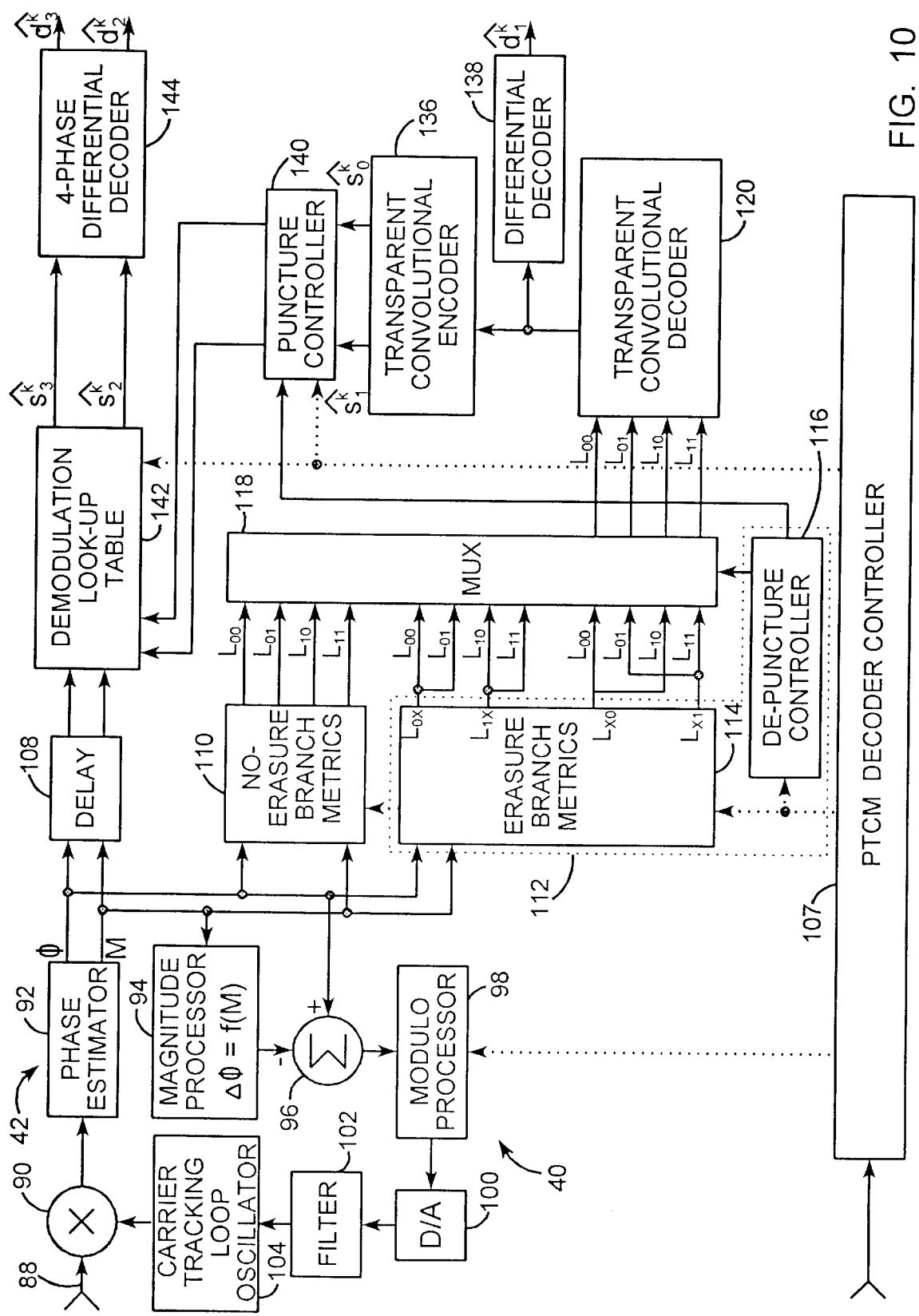
FIG. 10 shows a block diagram of a PTCM decoder portion of the communication system shown in FIG. 2.

FIG. 10 shows a block diagram of a portion of receiver 40 and of PTCM decoder 42. Referring to FIG. 10, an IF signal is supplied at a node 88 within receiver 40. Node 88 couples to a mixer 90, where the IF signal is downconverted to baseband. A phase estimator 92 couples to mixer 90 to convert the baseband signal into quadrature data. Phase estimator 92 may include analog-to-digital conversion and may output the quadrature data in accordance with either a polar ($\phi$, M) or rectilinear (I,Q) coordinate system. FIG. 10 denotes the polar coordinate system for convenience, but those skilled in the art will appreciate that all operations discussed herein in connection with the polar coordinate system may likewise be carried out in accordance with a rectilinear coordinate system.

The magnitude portion of the quadrature data is supplied to a magnitude processor 94, and the phase portion of the quadrature data is supplied to a positive input of a summing circuit 96. Magnitude processor 94 outputs a phase angle offset ($\Delta\phi$) that is determined as a function of magnitude (f(M)). Referring to FIG. 4, processor 94 desirably outputs a phase angle offset of approximately 22.5° for magnitude values approximately equivalent to the magnitude of the inner ring 74 and a phase angle offset of approximately 0° for magnitude values approximately equivalent to the magnitude of the outer ring 74. A wide range of functions that provide these phase angle offsets for the indicated magnitude values can be implemented by magnitude processor 94. The phase angle offset from magnitude processor 94 is supplied to a negative input of summing circuit 96.

Summing circuit 96 provides a phase angle that has been adjusted in response to the magnitude of quadrature data. While the quadrature data from phase estimator 92 may be noisy, the adjusted phase angle will tend to exhibit values that are concentrated at the phase values indicated in the outer ring 74 of constellation 70. In other words, summing circuit 96 provides adjusted phase angle data with eight locally discrete average values for constellation 70, and those eight values are integral multiples of 45°.

The output from summing circuit 96 couples to a modulo processor 98. Modulo processor 98 is configured to output deviations from the discrete phase values about which the adjusted phase angle data varies. These deviations are converted into an analog signal through a digital-to-analog (D/A) converter 100, then filtered in a loop filter 102. Filter 102 drives a carrier tracking loop oscillator 104, and an output of oscillator 104 couples back to mixer 90.

Accordingly, magnitude processor 94, summing circuit 96, modulo processor 98, digital-to-analog converter 100, filter 102, and oscillator 104 together form a carrier tracking loop 106. Loop 106 allows receiver 40 to recover the phase of communication signal 36 (FIG. 2) so that receiver 40 can coherently detect signal 36. Due to adjusted phase angle data provided by summing circuit 96, carrier tracking loop 106 locks at phase values that are integral multiples of 45° for constellation 70 depicted in FIG. 4.

In a preferred embodiment, a PTCM decoder controller 107 couples to modulo processor 98 and optionally to magnitude processor 94 (not shown). Controller 107 provides data sets which program carrier tracking loop 104 to operate upon diverse phase point constellations. For example, magnitude and modulo processor functions different from those used to accommodate constellation 70 (FIG. 4) may be programmed into magnitude processor 94 and modulo processor 98 to accommodate constellation 70' (FIG. 5).

The quadrature data from phase estimator 92 are also routed to a delay element 108, inputs of a no-erasure branch metrics processor 110, and inputs of a depuncture circuit 112. Depuncture circuit 112 includes an erasure branch metrics processor 114 and a de-puncture controller 116. The quadrature data from phase estimator 92 are routed to inputs of erasure branch metrics processor 114.

No-erasure branch metric processor 110 is a conventional branch metrics processor but is specifically adapted to accommodate the phase point constellation being received (e.g. constellation 70 or 70'). Those skilled in the art are familiar with branch metric processors and with various techniques for generating branch metrics. Desirably, no-erasure branch metric processor 110 is implemented using a random access memory (RAM), with quadrature data from phase estimator 92 being applied to address inputs of the RAM. Desirably, a data input to no-erasure branch metric processor 110 couples to PTCM decoder controller 107 so that different branch metrics are programmed into processor 110 to accommodate different modulation schemes.

As discussed above, two encoded bits and two uncoded bits are conveyed during each unit interval as four symbols. Accordingly, for each unit interval the quadrature data from phase estimator 92 describes two encoded/secondary symbols and two uncoded/primary symbols. These encoded symbols were denoted above in connection with FIG. 3 as $s_1^x$ and $s_0^x$. For each unit interval, branch metric processor 110 outputs four soft decision values corresponding to the inverse log likelihoods of the two encoded symbols having four different data values. Output $L_{00}$ provides a value describing the likelihood of $S_0$ being a 0 and $s_1$ being a 0, output $L_{01}$ provides a value describing the likelihood of $S_0$ being a 0 and $s_1$ being a 1, output $L_{10}$ provides a value describing the likelihood of $S_0$ being a 1 and $s_1$ being a 0, and output $L_{11}$ provides a value describing the likelihood of $S_0$ being a 1 and $s_1$ being a 1. Outputs $L_{00}$ through $L_{11}$ from no-erasure branch metric processor 110 are routed through a multiplexer (MUX) 118 to four corresponding inputs of a transparent convolutional decoder 120. In particular, these outputs are so routed during unit intervals where puncturing does not occur. The one of every two unit intervals in which symbols $s_1^0$ and $s_0^0$ are communicated represents a unit interval for which puncturing does not occur in the rate ⅞ example discussed above in connection with FIG. 3.

Erasure branch metric processor 114 outputs different branch metrics from those provided by no-erasure branch metric processor 110. In particular, the likelihood values generated by processor 114 are compensated to null out the influence of a second symbol during unit intervals when puncturing has occurred. The one of every two unit intervals in which symbols $s_1^4$ and $s_0^3$ are communicated represents a unit interval for which puncturing does occur in the rate ⅞ example discussed above in connection with FIG. 3.

Erasure branch metric processor 114 has four outputs. A $L_{0x}$ output provides a value describing the likelihood of $S_0$ being a 0 regardless of whether $S_1$ was a 0 or a 1. This output is duplicated and routed through multiplexer 118 to $L_{00}$ and $L_{01}$ inputs of convolutional decoder 120. A $L_{1x}$ output provides a value describing the likelihood of $S_0$ being a 1 regardless of whether $S_1$ was a 0 or a 1. This output is duplicated and routed through multiplexer 118 to $L_{10}$ and $L_{11}$ inputs of convolutional decoder 120. A $L_{x0}$ output provides a value describing the likelihood of $S_1$ being a 0 regardless of whether $S_0$ was a 0 or a 1. This output is duplicated and routed through multiplexer 118 to $L_{00}$ and $L_{10}$ inputs of convolutional decoder 120. A $L_{x1}$ output provides a value describing the likelihood of $S_1$ being a 1 regardless of whether $S_0$ was a 0 or a 1. This output is duplicated and routed through multiplexer 118 to $L_{01}$ and $L_{11}$ inputs of convolutional decoder 120.

During unit intervals when puncturing does occur, the $L_{0x}$ and $L_{1x}$ outputs and their duplicates are routed through multiplexer 118 and the $L_{x0}$ and $L_{x1}$ outputs and their duplicates are routed through multiplexer 118. The $L_{0x}$ and $L_{1x}$ outputs and their duplicates provide symbol branch metrics and erasure value branch metrics for the conveyed symbol $s_0^3$ and its punctured pair mate $s_1^3$ (FIG. 3). Likewise, the $L_{x0}$ and $L_{x1}$ outputs and their duplicates provide symbol branch metrics and erasure value branch metrics for the conveyed symbol $s_1^4$ and its punctured pair mate $s_0^4$ (FIG. 3).

Erasure branch metric processor 114 is desirably implemented using RAM, with quadrature phase estimate data driving the RAM address inputs. Desirably, a data input of the RAM couples to PTCM decoder controller 107 so that new erasure branch metrics may be programmed into the RAM for different types of modulations. Likewise, depuncture controller 116 desirably couples to PTCM decoder controller 107 and is programmed with data sets that define timing for operating multiplexer 118 so that the outputs from processors 110 and 114 are appropriately routed through multiplexer 118. In one embodiment (not shown), de-puncture controller 116 includes two shift registers loaded in parallel with a data set pattern from controller 107 and clocked at twice the unit interval rate so that the data set patterns circulate therein. These data set patterns drive selection inputs of multiplexer 118.

Figure 11:
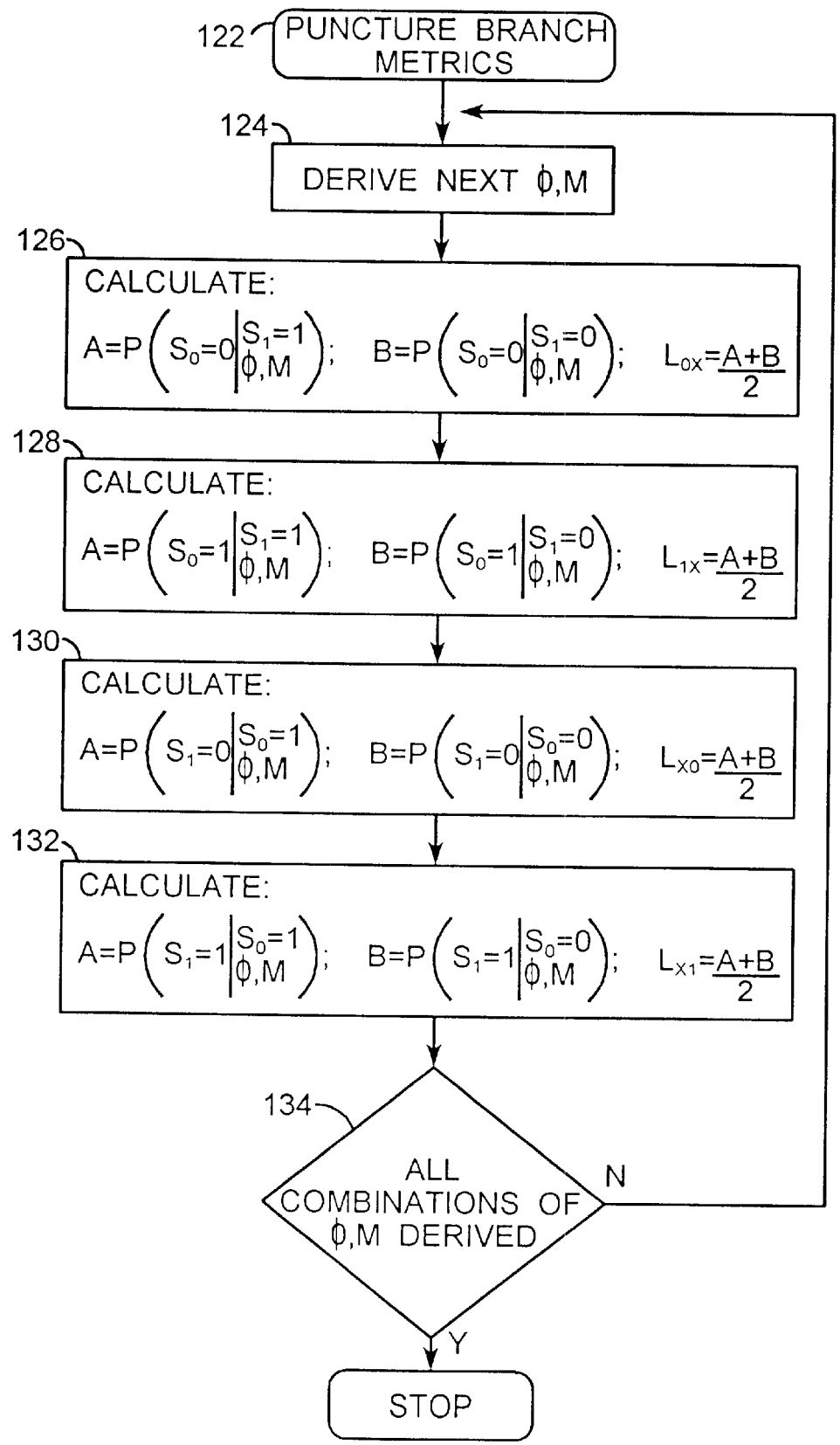
FIG. 11 shows a flow chart of an exemplary puncture branch metrics process that can be used to generate branch metrics for a depuncture circuit of the PTCM decoder of FIG. 10.

FIG. 11 shows a flow chart of an exemplary puncture branch metrics process 122 that can be used to generate branch metrics for depuncture circuit 112. Desirably, process 122 is performed off-line so that branch metrics are calculated in advance and then programmed into depuncture circuit 112 prior to their use. Process 122 is an exemplary process that illustrates the manner in which erasure values and erasure value likelihoods preferably vary in response to phase estimate values.

Process 122 operates in a loop wherein one iteration of the loop is performed for each possible phase estimate value (φ,M) that can be generated by phase estimator 92 (FIG. 10). A task 124 of process 122 is performed to derive the next phase estimate value (φ,M) to be processed. After task 124, a series of calculation tasks are performed.

A calculation task 126 determines the $L_{0x}$ output for the current phase estimate value (φ,M). Task 126 calculates chances or probabilities "A" and "B". Chance or probability A represents the likelihood that $s_0^3$ is a 0 assuming a priori knowledge that its post-puncturing mate $s_1^4$ is a 1 and given the current phase estimate value ($\phi$,M). Chance or probability B represents the likelihood that $s_0^3$ is a 0 assuming a priori knowledge that its post-puncturing mate $s_1^4$ is a 0 and given the current phase estimate value ($\phi$,M). In addition, task 126 finds the average of chances A and B and uses that average for the likelihood value $L_{0x}$ at the current phase estimate value ($\phi$,M). As discussed above, the encoded symbols are not independent of one another through the use of P-APSK constellations such as constellations 70 (FIG. 4) and 70' (FIG. 5). But, the influence that symbol $s_1^4$ exerts on symbol $s_0^3$ is nulled out.

Calculation tasks 128, 130, and 132 calculate chances "A" and "B" and the resulting average in a similar manner. Task 128 determines the $L_{1x}$ output for the current phase estimate value ($\phi$,M). Chance or probability A now represents the likelihood that $s_0^3$ is a 1 assuming a priori knowledge that its post-puncturing mate $s_1^4$ is a 1 and given the current phase estimate value ($\phi$,M). Chance or probability B now represents the likelihood that $s_0^3$ is a 1 assuming a priori knowledge that its post-puncturing mate $s_1^4$ is a 0 and given the current phase estimate value ($\phi$,M). The average of chances A and B is used for the likelihood value $L_{1x}$ at the current phase estimate value ($\phi$,M).

Task 130 determines the $L_{x0}$ output for the current phase estimate value ($\phi$,M). Chance or probability A now represents the likelihood that $s_1^4$ is a 0 assuming a priori knowledge that its post-puncturing mate $s_0^3$ is a 1 and given the current phase estimate value ($\phi$,M). Chance or probability B now represents the likelihood that $s_1^4$ is a 0 assuming a priori knowledge that its post-puncturing mate $s_0^3$ is a 0 and given the current phase estimate value ($\phi$,M). The average of chances A and B is used for the likelihood value $L_{x0}$ at the current phase estimate value ($\phi$,M).

Task 132 determines the $L_{x1}$ output for the current phase estimate value ($\phi$,M). Chance or probability A now represents the likelihood that $S_1^4$ is a 1 assuming a priori knowledge that its post-puncturing mate $s_0^3$ is a 1 and given the current phase estimate value ($\phi$,M). Chance or probability B now represents the likelihood that $s_1^4$ is a 1 assuming a priori knowledge that its post-puncturing mate $s_0^3$ is a 0 and given the current phase estimate value ($\phi$,M). The average of chances A and B is used for the likelihood value $L_{x1}$ at the current phase estimate value ($\phi$,M).

After task 132, a query task 134 determines whether all possible phase estimate values ($\phi$,M) have been processed. If less than all possible phase estimate values ($\phi$,M) have been processed, program control loops back to task 124 to process another phase estimate value. When all possible phase estimate values ($\phi$,M) have been processed, program control stops. Branch metric data for storing in erasure branch metrics processor 114 has been generated.

Referring back to FIG. 10, convolutional decoder 120 performs a complementary operation to that performed by convolutional encoder 62 (FIG. 3). Accordingly, convolutional decoder 120 produces one information bit estimate for each set of four likelihood values it receives from multiplexer 118. In the exemplary rate ⅞ embodiment, decoder 120 produces three information bit estimates for every two unit intervals. Those skilled in the art will appreciate that convolutional decoder 120 may process each set of likelihood values from multiplexer 118 over numerous unit intervals (e.g. typically more than 64) before generating a data estimate. In addition, those skilled in the art will appreciate that a FIFO or other rate converting device (not shown) may be used for buffering between multiplexer 118 and decoder 120.

An output of convolutional decoder 120 provides the secondary stream of data estimates to a rate ½, transparent, convolutional encoder 136 and to a differential decoder 138. Differential decoder 138 complements the operation of differential encoder 56 of PTCM encoder 28 (FIG. 3). As discussed above, due to a possible phase synchronization ambiguity, receiver 40 may synchronize at a phase state that causes the outputs from decoder 120 to be inverted from their true states. Differential decoder 138 recovers the true data regardless of whether the data estimates from convolutional decoder 120 are inverted.

Convolutional encoder 136 is desirably identical to convolutional encoder 62 of PTCM encoder 28 (FIG. 3). If convolutional encoder 62 implements a given rate 1/N code, with N>1, then convolutional encoder 136 implement that same code. Accordingly, if the secondary stream of data estimates correctly estimates secondary user information bit stream 52 (FIG. 3), then a secondary stream of symbol estimates produced by convolutional encoder 136 includes symbol estimates that equal corresponding symbols produced by convolutional encoder 62 in PTCM encoder 28. Three pairs of symbol estimates are produced by encoder 136 for every two unit intervals in the rate ⅞ example discussed herein. Since convolutional encoder 136 implements a transparent code, if it receives inverted data due to the possible phase ambiguity, then both output symbols are inverted. Convolutional encoder 136 generates a re-encoded bit stream which is provided to a puncture controller 140.

Puncture controller 140 provides substantially the same operation as is provided by puncture controller 64 in PTCM encoder 28 (FIG. 3). Accordingly, puncture controller 140 generates a symbol stream identical to that used to drive mapping circuit 68 in PTCM encoder 28 (FIG. 3), assuming that no bit errors have occurred. Puncture controller 140 couples to de-puncture controller 116 to obtain timing synchronization to identify when to puncture out re-coded symbols and when to combine unpunctured symbols generated from different data estimates. Likewise, puncture controller 140 desirably couples to PTCM decoder controller 107 so that it is programmed with a data set that defines the puncture timing.

Outputs from delay element 108 and from puncture controller 140 couple to a slicer 142 preferably implemented as a demodulation look-up table. Delay element 108 delays estimated phase values by a sufficient duration to achieve coincidence between symbols of the primary and secondary streams. Coincidence is achieved when a re-encoded bit stream symbol estimate from puncture controller 140 is output at the same instant the phase estimate value which conveyed the re-encoded bit stream symbol estimate is output from delay element 108.

Slicer 142 performs two operations in the preferred embodiment. In a first operation, secondary modulation, as specified by the secondary re-encoded bit stream, is removed from the phase estimate value presented for each unit interval. Referring to FIG. 4, the secondary modulation for the 16 P-APSK example constellation 70 is removed by rotating the phase estimate value by 45° when the least significant re-encoded bit equals a one and rotating the phase estimate value by 0° when the least significant re-encoded bit equals a zero. In addition to this selective rotation, an additional rotation of 22.5° is performed when the two re-encoded bits do not equal each other, but no additional rotation is performed when the two re-encoded bits equal each other. After removing the secondary modulation, the phase estimates describe the QPSK primary modulation from which constellation 70 was derived.

After removal of the secondary modulation, slicer 142 performs the second of its two operations. In this second operation a conventional QPSK slicing or demodulation operation is performed to estimate which two primary/uncoded bits are conveyed by the primary QPSK modulation. The resulting data estimates are output from slicer 142 at a rate of two primary/uncoded data bit estimates per unit interval.

In the preferred embodiment, the above-described two operations of slicer 142 are simultaneously performed through a table look-up operation. In this preferred embodiment, slicer 142 is implemented in RAM. A data input of the RAM couples to PTCM decoder controller 107 so that a data set which both removes the secondary modulation and demodulates a given phase point constellation is programmed into the RAM as required. Accordingly, for any combination of data estimate input and re-encoded bit stream, an output is provided indicating the resulting uncoded information bit estimates, often referred to as hard decisions. Moreover, those skilled in the art will appreciate that various data compression techniques may be applied to minimize the size of the RAM. By implementing slicer 142 in the form of a demodulation look-up table that simultaneously compensates for or otherwise removes secondary modulation from phase estimates, a variety of modulation types can be demodulated using one set of hardware. Thus, the same slicer that removes secondary modulation and performs a QPSK slicing operation to process constellation 70 (FIG. 4) can be re-programmed to remove secondary modulation and perform a 12/4, P-APSK slicing operation to process constellation 70' (FIG. 5) and to process other phase point constellations.

The uncoded/primary bit estimates output from slicer 142 are input to a 4-phase differential decoder 144. Differential decoder 144 complements the operation of differential encoder 54 of PTCM encoder 28 (FIG. 3) in support of rotational invariant operation. As discussed above, due to a possible phase ambiguity, receiver 40 may synchronize at an ambiguous phase state. However, the absolute phase reference currently being used by receiver 40, has no influence over the changes in phase estimate values from unit interval to unit interval. Accordingly, differential decoder 144 recovers the true data regardless of the phase state to which receiver 40 has synchronized.

In summary, the present invention provides an improved data communication system and method. A P-APSK phase point constellation is provided with a labeling scheme that causes its primary and secondary sub-constellations to be suitable for PTCM communication schemes. In particular, the P-APSK phase constellation is desirably used in peak power limited channels. In adapting a P-APSK constellation for use in a PTCM communication scheme, minimum primary sub-constellation Euclidean distances are maximized while the quantity of such distances is minimized. The present invention also accommodates puncturing even though encoded symbols are dependent upon one another. Moreover, the PTCM data communication system is programmable to operate in connection with a variety of diverse modulation formats, orders and code rates.

The present invention has been described above with reference to preferred embodiments. However, those skilled in the art will recognize that changes and modifications may be made in these preferred embodiments without departing from the scope of the present invention. These and other changes and modifications which are obvious to those skilled in the art are intended to be included within the scope of the present invention.

What is claimed is:

1. An apparatus for decoding a punctured, convolutionally encoded data stream, said apparatus comprising:
   a phase estimator configured to generate phase estimate values;
   a depuncture circuit coupled to said phase estimator, said depuncture circuit being configured to periodically generate erasure values so that said erasure values vary in response to said phase estimate values; and
   a convolutional decoder coupled to said depuncture circuit and configured to be responsive to said erasure values.

2. A decoding apparatus as claimed in claim 1 wherein:
   said convolutionally encoded data stream is received throughout a multiplicity of unit intervals, puncturing does not occur in a first portion of said unit intervals, and puncturing does occur in a second portion of said unit intervals;
   said apparatus additionally comprises a first branch metric processor configured to generate branch metrics for use by said convolutional decoder during said first portion of said unit intervals, said first branch metric processor being responsive to said phase estimate values; and
   said depuncture circuit comprises a second branch metric processor configured to generate branch metrics for use by said convolutional decoder during said second portion of said unit intervals, said second branch metric processor being responsive to said phase estimate values.

3. A decoding apparatus as claimed in claim 2 wherein:
   said first branch metric processor supplies two unpunctured likelihood values to said convolutional decoder for each phase estimate value to which said first branch metric processor responds; and
   said second branch metric processor is configured to provide a first likelihood value and a duplicate of said first likelihood value to said convolutional decoder for each phase estimate value to which said second branch metric processor responds.

4. A decoding apparatus as claimed in claim 3 wherein said second branch metric processor is configured to provide a second likelihood value and a duplicate of said second likelihood value to said convolutional decoder for each phase estimate value to which said second branch metric processor responds.

5. A decoding apparatus as claimed in claim 4 wherein:
   said second branch metric processor is further configured to supply a third likelihood value and a duplicate of said third likelihood value to said convolutional decoder so that said first likelihood value and duplicate are routed to first and second inputs of said convolutional decoder for each phase estimate value to which said second branch metric processor responds, and so that said third likelihood value and duplicate are routed to third and fourth inputs of said convolutional decoder for each phase estimate value to which said second branch metric processor responds;
   said second branch metric processor is further configured to supply a fourth likelihood value and a duplicate of said fourth likelihood value to said convolutional decoder so that said second likelihood value and duplicate are routed to said first and third inputs of said convolutional decoder for each phase estimate value to which said second branch metric processor responds, and so that said fourth likelihood value and duplicate are routed to said second and fourth inputs of said convolutional decoder for each phase estimate value to which said second branch metric processor responds; and said first branch metric processor supplies fifth, sixth, seventh, and eighth likelihood values to said first, second, third, and fourth inputs of said convolutional decoder for each phase estimate value to which said first branch metric processor responds.

6. A decoding apparatus as claimed in claim 2 wherein:

each phase estimate value conveys first and second convolutionally encoded symbols;

for one of said phase estimate values, said second branch metric processor generates a value describing the likelihood that said first symbol exhibits a predetermined polarity; and said second branch metric processor is configured so that said second branch metric processor likelihood value is compensated to null out influence of said second symbol.

7. A decoding apparatus as claimed in claim 6 wherein:

said first branch metric processor generates a value describing the likelihood that said first symbol exhibits said predetermined polarity; and said first branch metric processor is configured so that said first branch metric processor likelihood value is influenced by said second symbol.

8. A decoding apparatus as claimed in claim 6 wherein:

said likelihood value approximately equals an average of a first chance value and a second chance value;

said first chance value represents the likelihood that said first symbol exhibits said predetermined polarity given said one phase estimate value and assuming a priori knowledge that said second symbol exhibits said predetermined polarity; and said second chance value represents the likelihood that said first symbol exhibits said predetermined polarity given said one phase estimate value and assuming a priori knowledge that said second symbol exhibits a polarity opposite to said predetermined polarity.

9. A decoding apparatus as claimed in claim 6 wherein:

for said one phase estimate value, said second branch metric processor generates a value describing the likelihood that said second symbol exhibits said predetermined polarity; and said second branch metric processor is configured so that said second symbol likelihood value is compensated to null out influence of said first symbol.

10. A decoding apparatus as claimed in claim 9 wherein:

said first symbol likelihood value approximately equals an average of a first chance value and a second chance value;

said first chance value represents the likelihood that said first symbol exhibits said predetermined polarity given said one phase estimate value and assuming a priori knowledge that said second symbol exhibits said predetermined polarity;

said second chance value represents the likelihood that said first symbol exhibits said predetermined polarity given said one phase estimate value and assuming a priori knowledge that said second symbol exhibits a polarity opposite to said predetermined polarity;

said second symbol likelihood value approximately equals an average of a third chance value and a fourth chance value;

said third chance value represents the likelihood that said second symbol exhibits said predetermined polarity given said one phase estimate value and assuming a priori knowledge that said first symbol exhibits said predetermined polarity; and said fourth chance value represents the likelihood that said second symbol exhibits said predetermined polarity given said one phase estimate value and assuming a priori knowledge that said first symbol exhibits a polarity opposite to said predetermined polarity.

11. A decoding apparatus as claimed in claim 1 wherein said depuncture circuit comprises a memory element configured to be downloaded with different data sets, said different data sets being configured to control depuncturing for different code rates.

12. A decoding apparatus as claimed in claim 1 wherein:

said data stream is configured in accordance with a polar amplitude phase shift keyed (P-APSK), pragmatic trellis coded modulation (PTCM) scheme;

said convolutional decoder is configured to provide a second stream of data estimates;

said decoding apparatus additionally comprises a convolutional encoder adapted to encode said second stream of data estimates to produce a re-encoded bit stream; and said decoding apparatus additionally comprises a slicer configured to form a first stream of data estimates in response to said re-encoded bit stream and said phase estimate values.

13. A decoding apparatus as claimed in claim 1 wherein:

said data stream is configured in accordance with a polar amplitude phase shift keyed (P-APSK) modulation scheme;

said phase estimate values convey quadrature phase and magnitude data; and said decoding apparatus additionally comprises a carrier phase recovery loop having an input coupled to said phase estimator and being configured to adjust said quadrature phase data in response to said quadrature magnitude data to generate a phase-adjusted signal, said phase-adjusted signal being used for carrier tracking.

14. A method for decoding a punctured, convolutionally encoded data stream comprising the steps of:

a) generating phase estimate values from a received signal;

b) periodically producing erasure values so that said erasure values vary in response to said phase estimate values; and c) convolutionally decoding in response to said erasure values.

15. A method as claimed in claim 14 wherein:

said convolutionally encoded data stream is received throughout a multiplicity of unit intervals, puncturing does not occur in a first portion of said unit intervals, and puncturing does occur in a second portion of said unit intervals;

said method additionally comprises the step of generating first branch metrics for use in said decoding step during unit intervals where puncturing does not occur, said first branch metrics being responsive to said phase estimate values; and said erasure value producing step comprises the step of generating second branch metrics for use in said decoding step during unit intervals where puncturing does occur, said second branch metrics being responsive to said phase estimate values.

16. A method as claimed in claim 15 wherein:
said first branch metric generating step generates two likelihood values for each phase estimate value to which said first branch metric generating step responds; and
said second branch metric generating step generates a first likelihood value and a duplicate of said first likelihood value for each phase estimate value to which said second branch metric generating step responds.

17. A method as claimed in claim 16 wherein said second branch metric generating step comprises the step of providing a second likelihood value and a duplicate of said second likelihood value for each phase estimate value to which said second branch metric generating step responds.

18. A method as claimed in claim 17 wherein:
said decoding step is performed in a convolutional decoder having first, second, third, and fourth inputs;
said second branch metric generating step comprises the step of supplying a third likelihood value and a duplicate of said third likelihood value so that said first likelihood value and duplicate are routed to said first and second inputs of said convolutional decoder, and so that said third likelihood value and duplicate are routed to said third and fourth inputs of said convolutional decoder;
said second branch metric generating step additionally comprises the step of supplying a fourth likelihood value and a duplicate of said fourth likelihood value so that said second likelihood value and duplicate are routed to said first and third inputs of said convolutional decoder and so that said fourth likelihood value and duplicate are routed to said second and fourth inputs of said convolutional decoder; and
said first branch metric generating step comprises the step of supplying fifth, sixth, seventh, and eighth likelihood values to said first, second, third, and fourth inputs of said convolutional decoder for each phase estimate value to which said first branch metric generating step responds.

19. A method as claimed in claim 15 wherein:
each phase estimate value conveys first and second convolutionally encoded symbols;
for one of said phase estimate values, said second branch metric generating step generates a value describing the likelihood that said first symbol exhibits a predetermined polarity; and
said second branch metric generating step comprises the step of compensating said first symbol likelihood value to null out influence of said second symbol.

20. A method as claimed in claim 19 wherein:
said first branch metric generating step generates a value describing the likelihood that said first symbol exhibits said predetermined polarity; and
said first branch metric generating step is configured so that said first branch metric likelihood value is influenced by said second symbol.

21. A method as claimed in claim 19 wherein:
said likelihood value approximately equals an average of a first chance value and a second chance value;
said first chance value represents the likelihood that said first symbol exhibits said predetermined polarity given said one phase estimate value and assuming a priori knowledge that said second symbol exhibits said predetermined polarity; and
said second chance value represents the likelihood that said first symbol exhibits said predetermined polarity given said one phase estimate value and assuming a priori knowledge that said second symbol exhibits a polarity opposite to said predetermined polarity.

22. A method as claimed in claim 19 wherein:
for said one phase estimate value, said second branch metric generating step generates a value describing the likelihood that said second symbol exhibits said predetermined polarity; and
said second branch metric generating step comprises the step of compensating said second symbol likelihood value to null out influence of said first symbol.

23. A method as claimed in claim 22 wherein:
said first symbol likelihood value approximately equals an average of a first chance value and a second chance value;
said first chance value represents the likelihood that said first symbol exhibits said predetermined polarity given said one phase estimate value and assuming a priori knowledge that said second symbol exhibits said predetermined polarity;
said second chance value represents the likelihood that said first symbol exhibits said predetermined polarity given said one phase estimate value and assuming a priori knowledge that said second symbol exhibits a polarity opposite to said predetermined polarity;
said second symbol likelihood value approximately equals an average of a third chance value and a fourth chance value;
said third chance value represents the likelihood that said second symbol exhibits said predetermined polarity given said one phase estimate value and assuming a priori knowledge that said first symbol exhibits said predetermined polarity; and
said fourth chance value represents the likelihood that said second symbol exhibits said predetermined polarity given said one phase estimate value and assuming a priori knowledge that said first symbol exhibits a polarity opposite to said predetermined polarity.

24. A method as claimed in claim 14 wherein:
said erasure value producing step is performed in a programmable depuncture circuit; and
said method additionally comprises the step of programming said depuncture circuit with different data sets, said different data sets being configured to control depuncturing for different code rates.

25. A method as claimed in claim 14 wherein:
said data stream is configured in accordance with a pragmatic trellis coded modulation (PTCM) scheme;
said decoding step provides a second stream of data estimates;
said method additionally comprises the step of convolutionally encoding said second stream of data estimates to produce a re-encoded bit stream; and
said method additionally comprises the step of forming a first stream of data estimates in response to said re-encoded bit stream and said phase estimate values.

26. A method as claimed in claim 25 wherein said forming step comprises the step of decoding a polar amplitude phase shift keyed (P-APSK) modulation.

27. A method as claimed in claim 26 wherein said phase estimate values convey quadrature phase and magnitude data, and said method additionally comprises the step of:
operating a carrier phase recovery loop configured to adjust said quadrature phase data in response to said quadrature magnitude data to generate a phase-adjusted signal, said phase-adjusted signal being used for carrier tracking.

28. A method as claimed in claim 26 wherein said pragmatic trellis coded modulation scheme is amplitude phase shift keyed (APSK) modulation, said phase estimate values convey quadrature phase and magnitude for each unit interval, and said method additionally comprises the step of:

adjusting said quadrature phase in response to said quadrature magnitude to generate a phase-adjusted signal; and controlling a carrier tracking loop in response to said phase-adjusted signal.

29. A method as claimed in claim 25 wherein said forming step comprises the step of addressing a memory element with said phase estimate values and said re-encoded bit stream.

30. A method as claimed in claim 25 wherein said PTCM scheme is rotationally invariant, and said method additionally comprises the steps of:

differentially decoding said first stream of data estimates; and differentially decoding said second stream of data estimates.

31. A programmable apparatus for decoding information bits communicated at a variety of data rates using a pragmatic modulation scheme that applies a primary modulation to a first portion of said information bits, convolutional encoding to a second portion of said information bits to generate an encoded bit stream, and a secondary modulation to said encoded bit stream, said apparatus comprising:

a phase estimator configured to generate a phase estimate stream having a phase estimate value for each unit interval;

a convolutional decoder coupled to said phase estimator, said convolutional decoder being configured to receive and decode said phase estimate values to produce a decoded data stream that corresponds to said second portion of said information bits;

a convolutional encoder coupled to said convolutional decoder to generate a re-encoded bit stream; and a demodulation look-up table coupled to said phase estimator and to said convolutional encoder, said table being configured to generate hard data estimates which correspond to said first portion of said information bits in response to said phase estimate values and said re-encoded bit stream.

32. A programmable decoding apparatus as claimed in claim 31 wherein:

said pragmatic modulation scheme implements a phase point constellation that includes a plurality of primary sub-constellations identified by said encoded bit stream and a plurality of secondary sub-constellations identified by said first portion of said information bits; and said look-up table is configured to generate data estimate decisions based upon primary sub-constellations identified by said re-encoded bit stream.

33. A programmable decoding apparatus as claimed in claim 31 wherein said pragmatic modulation scheme is rotationally invariant, and said decoding apparatus additionally comprises:

a first differential decoder coupled to said look-up table to generate data estimates of said first portion of said information bits; and a second differential decoder coupled to said convolutional decoder to generate data estimates of said second portion of said information bits.

34. A programmable decoding apparatus as claimed in claim 31 wherein said pragmatic modulation scheme is amplitude phase shift keyed (APSK) modulation, said phase estimate stream conveys quadrature phase and magnitude for each unit interval, and said decoding apparatus additionally comprises:

a carrier phase recovery loop having an input coupled to said phase estimator and being configured to adjust said quadrature phase in response to said quadrature magnitude to generate a phase-adjusted signal, said phase-adjusted signal being used for carrier tracking.

35. A programmable decoding apparatus as claimed in claim 31 wherein said pragmatic modulation scheme employs puncturing in connection with said convolutional encoding, and said decoding apparatus additionally comprises:

a depuncture circuit coupled between said phase estimator and said convolutional decoder, said depuncture circuit being configured to periodically generate erasure values so that said erasure values vary in response to said phase estimate values generated by said phase estimator.

36. A programmable decoding apparatus as claimed in claim 35 wherein:

said apparatus additionally comprises a first branch metric processor configured to generate branch metrics for use by said convolutional decoder during unit intervals where puncturing has not occurred, said first branch metric processor being responsive to said phase estimate values; and said depuncture circuit comprises a second branch metric processor configured to generate branch metrics for use by said convolutional decoder during unit intervals where puncturing has occurred, said second branch metric processor being responsive to said phase estimate values.

37. A programmable decoding apparatus as claimed in claim 36 wherein:

said first branch metric processor supplies two likelihood values to said convolutional decoder for each phase estimate value processed therein; and said second branch metric processor is configured to provide a first likelihood value and a duplicate of said first likelihood value to said convolutional decoder for each phase estimate value processed therethrough.

38. A programmable decoding apparatus as claimed in claim 37 wherein said second branch metric processor is configured to provide a second likelihood value and a duplicate of said second likelihood value to said convolutional decoder for each phase estimate value processed therethrough.

39. A programmable decoding apparatus as claimed in claim 36 wherein:

each phase estimate value conveys first and second convolutionally encoded symbols;

for one of said phase estimate values, said second branch metric processor generates a value describing the likelihood that said first symbol exhibits a predetermined polarity; and said second branch metric processor is configured so that said first symbol likelihood value is compensated to null out influence of said second symbol.

40. A programmable decoding apparatus as claimed in claim 35 wherein said depuncture circuit comprises a plurality of memory elements configured to be downloaded with different data sets, said different data sets being configured to control depuncturing for different code rates.

* * * * *